(12) United States Patent
Kim

(10) Patent No.: US 9,554,467 B2
(45) Date of Patent: Jan. 24, 2017

(54) PRINTED CIRCUIT BOARD AND SEMICONDUCTOR PACKAGE

(71) Applicant: SAMSUNG ELECTRONICS CO., LTD., Gyeonggi-do (KR)

(72) Inventor: Won-young Kim, Gyeonggi-do (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/820,784

(22) Filed: Aug. 7, 2015

(65) Prior Publication Data
US 2016/0135326 A1 May 12, 2016

(30) Foreign Application Priority Data
Nov. 12, 2014 (KR) .................. 10-2014-0157407

(51) Int. Cl.
| H05K 1/16 | (2006.01) |
|---|---|
| H05K 1/18 | (2006.01) |
| H01L 23/48 | (2006.01) |
| H05K 1/11 | (2006.01) |
| H05K 3/40 | (2006.01) |

(Continued)

(52) U.S. Cl.
CPC .............. *H05K 1/181* (2013.01); *H01L 23/48* (2013.01); *H01L 24/17* (2013.01); *H05K 1/113* (2013.01); *H05K 3/4038* (2013.01); *H05K 3/4084* (2013.01); *H01L 2224/16225* (2013.01); *H01L 2924/0002* (2013.01); *H01L 2924/15311* (2013.01); *H01L 2924/181* (2013.01); *H05K 1/0207* (2013.01); *H05K 1/0298* (2013.01)

(58) Field of Classification Search
CPC .............. H05K 1/00; H05K 1/02; H05K 1/09; H05K 1/11; H05K 1/16; H05K 3/02; H05K 3/10; H05K 3/30; H05K 3/46; H01L 21/02; H01L 21/60
USPC ........ 174/260, 250, 254, 257, 267; 257/778, 257/782; 361/782
See application file for complete search history.

(56) References Cited

U.S. PATENT DOCUMENTS

| 6,121,688 A * | 9/2000 | Akagawa .......... H01L 23/49816 257/737 |
|---|---|---|
| 6,418,615 B1 * | 7/2002 | Rokugawa ........ H01L 23/49811 257/E23.062 |
| 7,506,437 B2 | 3/2009 | Cho et al. |

(Continued)

FOREIGN PATENT DOCUMENTS

| JP | 2000312068 | 11/2000 |
|---|---|---|
| JP | 2005302969 | 10/2005 |
| KR | 101180366 | 8/2012 |

*Primary Examiner* — Xiaoliang Chen
(74) *Attorney, Agent, or Firm* — F. Chau & Associates, LLC

(57) ABSTRACT

Provided is a printed circuit board including a first conductive layer including a first conductive layer including a recessed portion, a protruding portion disposed at a higher level than that of the recessed portion, and a connecting portion connecting the recessed portion with the protruding portion. A second conductive layer is disposed above the recessed portion of the first conductive layer. A core layer is disposed between the first conductive layer and the second conductive layer. An upper solder resist layer is disposed on the second conductive layer. The upper solder resist layer exposes at least a portion of the protruding portion. A lower solder resist layer is disposed below the first conductive layer.

14 Claims, 35 Drawing Sheets

(51) Int. Cl.
  *H01L 23/00*   (2006.01)
  *H05K 1/02*    (2006.01)

(56)   References Cited

U.S. PATENT DOCUMENTS

| | | |
|---|---|---|
| 8,080,741 B2 | 12/2011 | Kang et al. |
| 8,115,300 B2 | 2/2012 | Muramatsu et al. |
| 8,241,968 B2 | 8/2012 | Lee et al. |
| 8,294,283 B2 | 10/2012 | Ihara |
| 8,450,843 B2 | 5/2013 | Sasaki et al. |
| 8,604,346 B2 * | 12/2013 | Uratsuji ............... H05K 1/0218 174/254 |
| 2009/0236727 A1 | 9/2009 | Murayama et al. |
| 2012/0181078 A1 * | 7/2012 | Inagaki ............... H01L 21/4857 174/267 |
| 2012/0186866 A1 * | 7/2012 | Mikado ................. H05K 1/185 174/260 |
| 2012/0216946 A1 | 8/2012 | Hondo |
| 2013/0182401 A1 * | 7/2013 | Furutani .............. H05K 1/0296 361/782 |
| 2013/0206466 A1 * | 8/2013 | Inagaki ............... H01L 21/4857 174/262 |
| 2013/0299218 A1 * | 11/2013 | Inagaki ............. H01L 23/49816 174/257 |
| 2014/0175661 A1 | 6/2014 | Kim et al. |

* cited by examiner

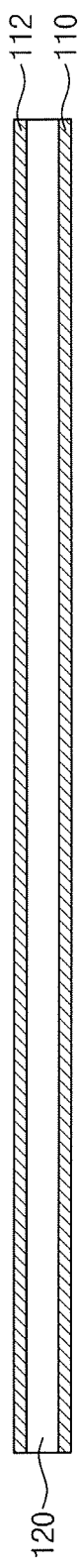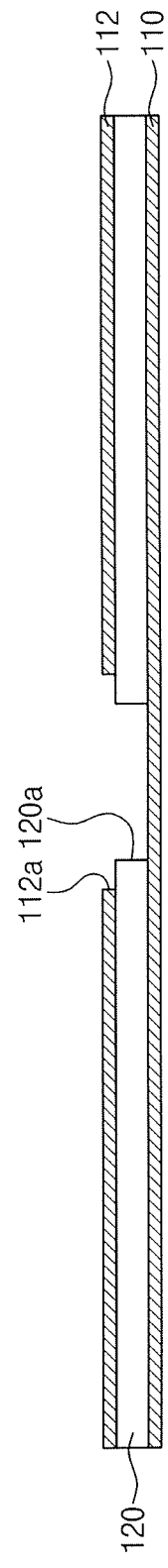

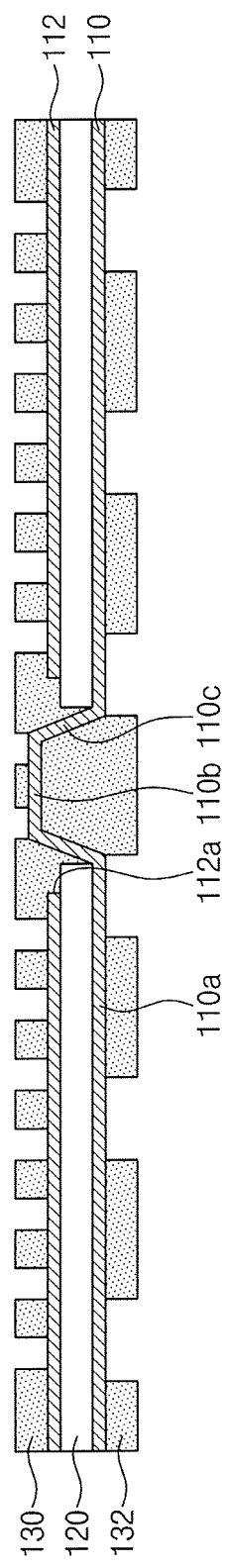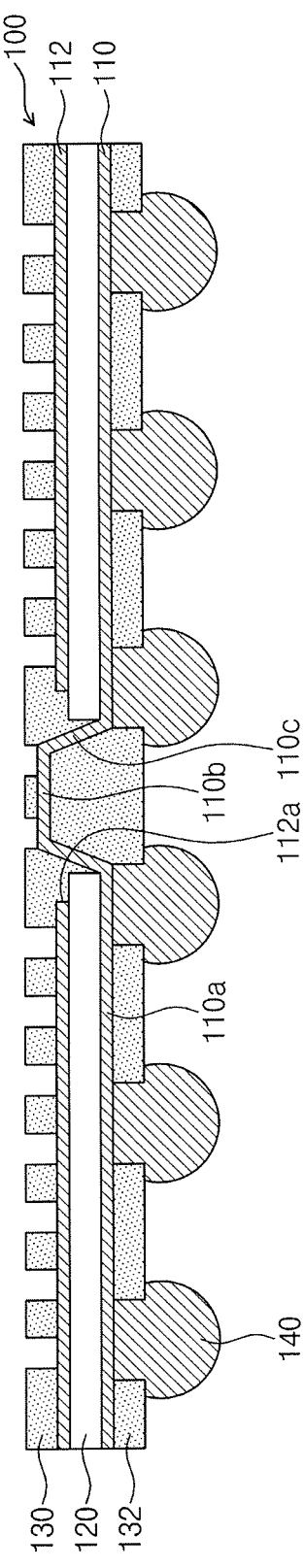

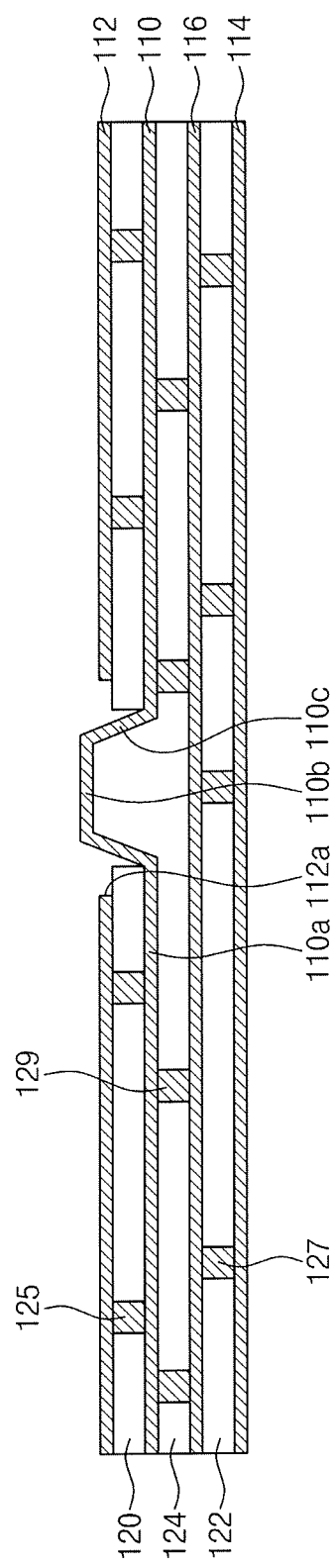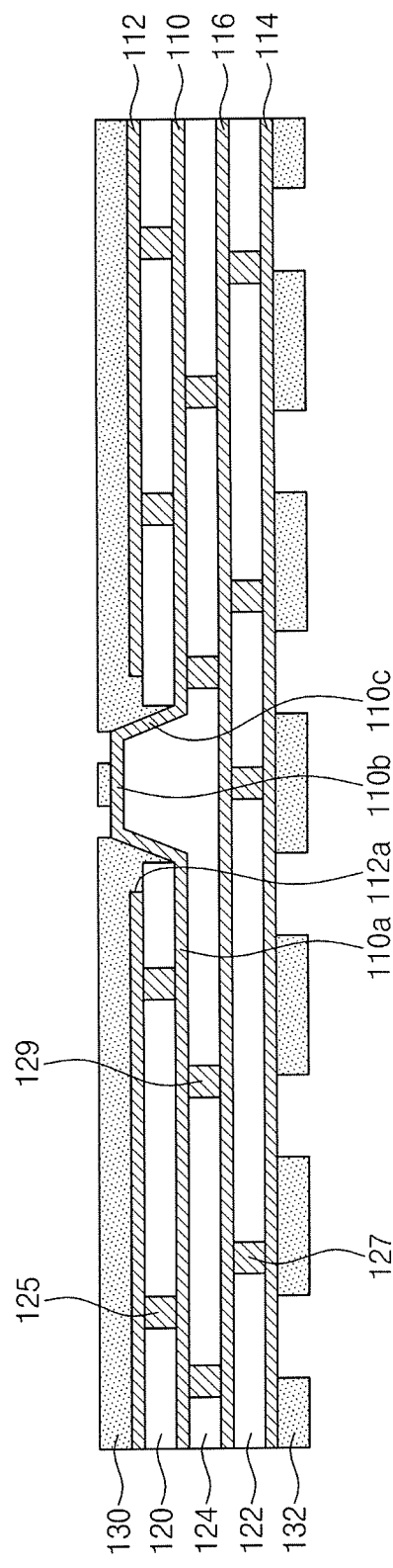

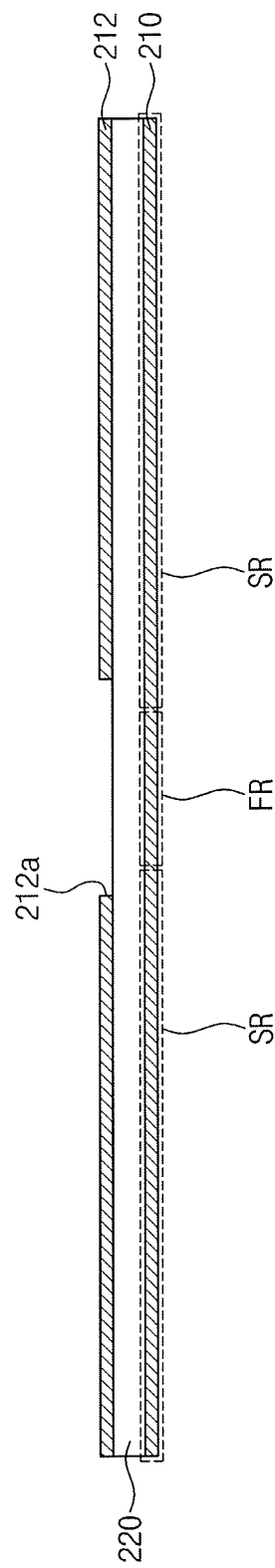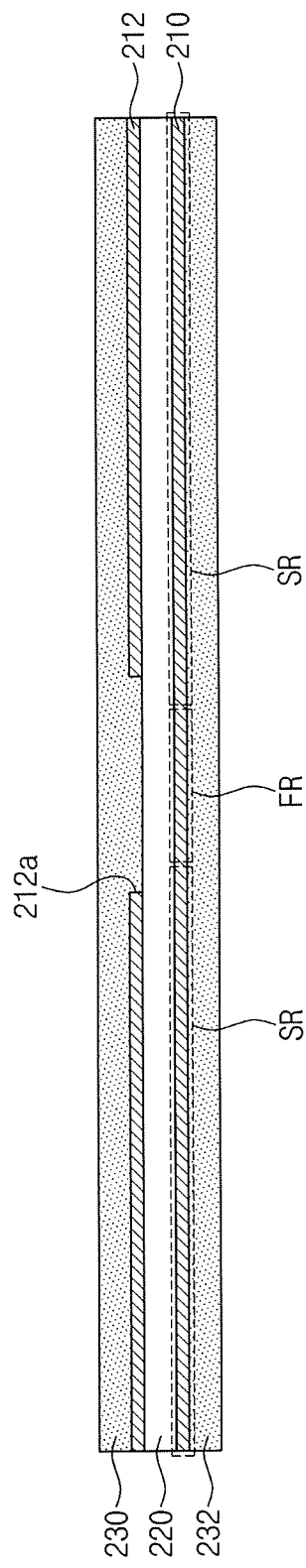

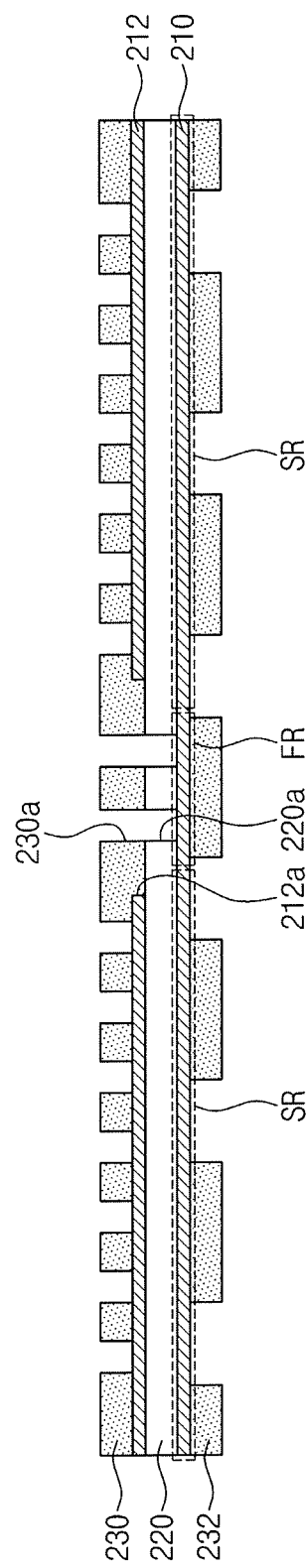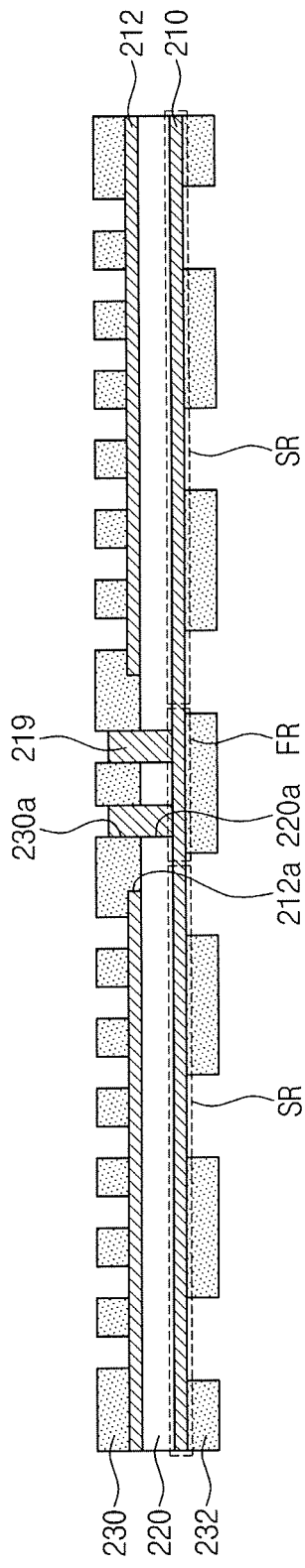

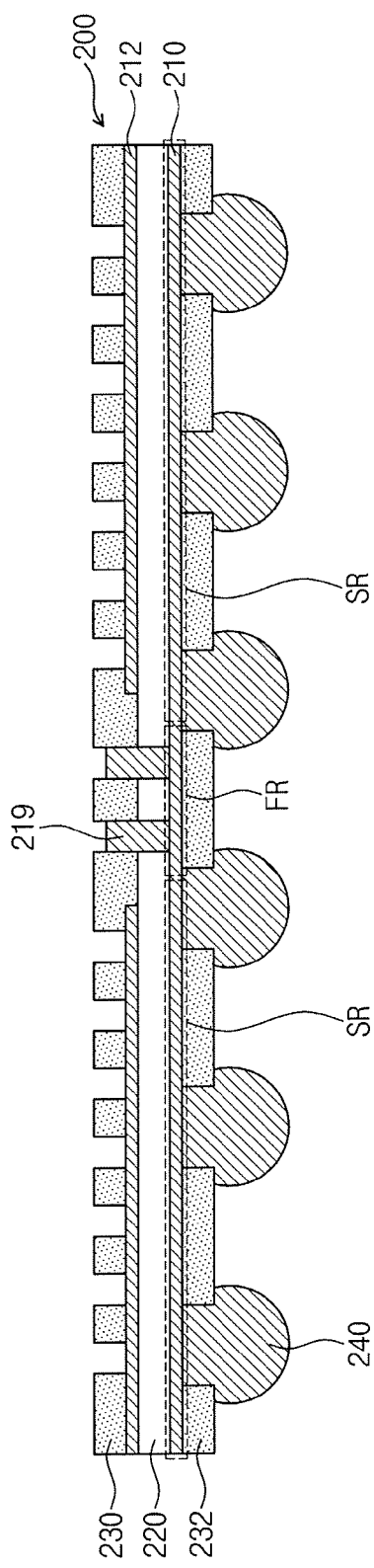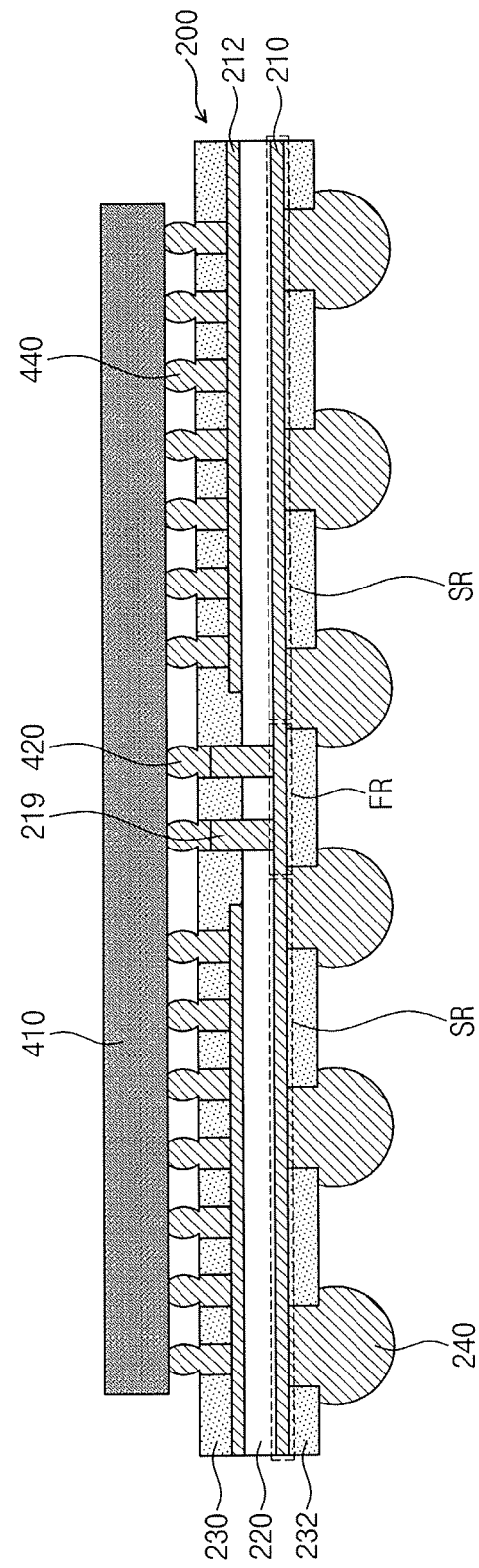

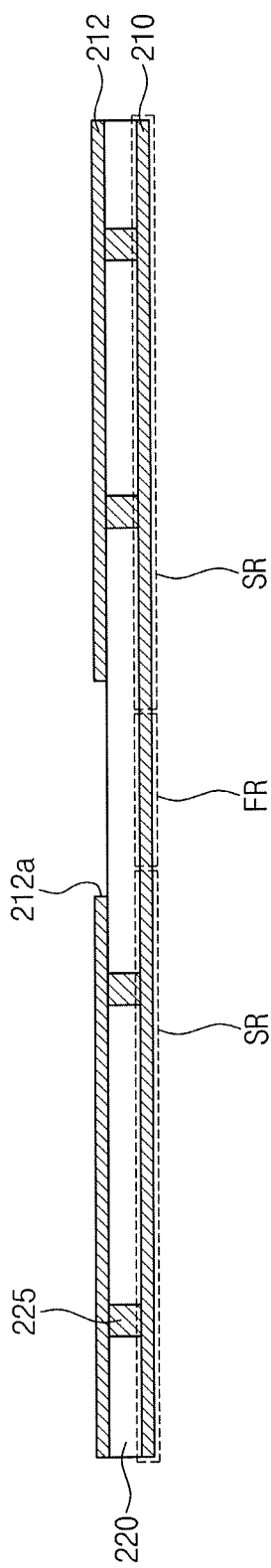
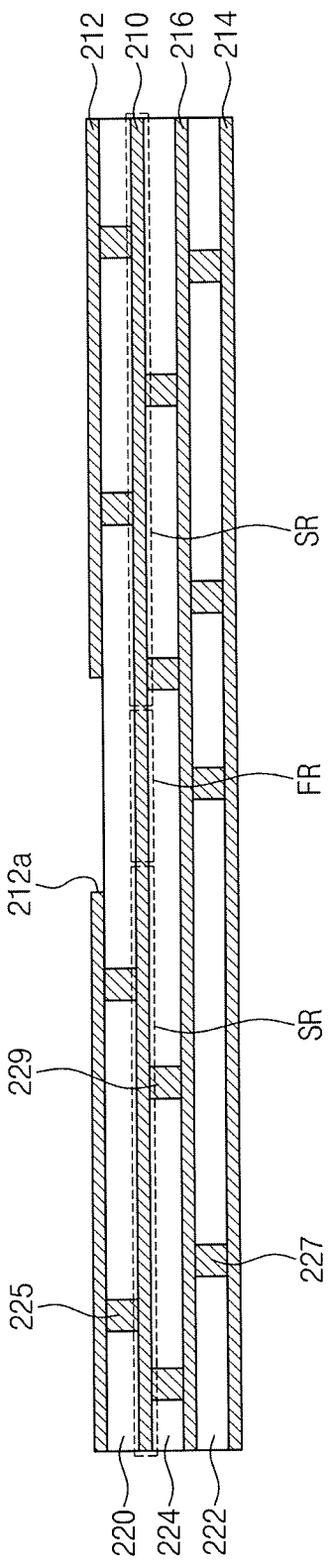

US 9,554,467 B2

PRINTED CIRCUIT BOARD AND SEMICONDUCTOR PACKAGE

CROSS-REFERENCE TO RELATED APPLICATION

This U.S. non-provisional patent application claims priority under 35 U.S.C. §119 to Korean Patent Application No. 10-2014-0157407, filed on Nov. 12, 2014, in the Korean Intellectual Property Office, the disclosure of which is incorporated by reference herein in its entirety.

TECHNICAL FIELD

Exemplary embodiments of the present inventive concept relate to a printed circuit board, and more particularly to a semiconductor package including the printed circuit board.

DISCUSSION OF RELATED ART

A printed circuit board may be used as a wiring substrate in a semiconductor package. A flip chip technology may be used to mount a semiconductor chip on a printed circuit board.

In the flip chip technology, the semiconductor chip may be flipped in such a way that its pads face a substrate, and the semiconductor chip may be electrically and mechanically connected to the substrate through bumps. The usage of the flip chip technology may reduce a weight and a thickness of a resulting semiconductor package and may decrease a connection length in electrical paths between the semiconductor chip and the substrate, thereby allowing increased electrical performance of the semiconductor package.

SUMMARY

Exemplary embodiments of the present inventive concept may provide a via-free printed circuit board.

Exemplary embodiments of the present inventive concept may provide a semiconductor package with increased electrical performance and thermal stability.

According to exemplary embodiments of the present inventive concept, a printed circuit board includes a first conductive layer including a recessed portion, a protruding portion disposed at a higher level than that of the recessed portion, and a connecting portion connecting the recessed portion with the protruding portion. A second conductive layer is disposed above the recessed portion of the first conductive layer. A core layer is disposed between the first conductive layer and the second conductive layer. An upper solder resist layer is disposed on the second conductive layer. The upper solder resist layer exposes at least a portion of the protruding portion. A lower solder resist layer is disposed below the first conductive layer.

According to exemplary embodiments of the present inventive concept, a semiconductor package includes a printed circuit board, a semiconductor chip disposed on the printed circuit board, and a mold layer encapsulating the semiconductor chip. The printed circuit board includes a first conductive layer including a recessed portion, a protruding portion disposed at a higher level than that of the recessed portion, and a connecting portion connecting the recessed portion with the protruding portion. A second conductive layer is disposed above the recessed portion of the first conductive layer. A core layer is disposed between the first conductive layer and the second conductive layer. An upper solder resist layer is disposed on the second conductive layer. The upper solder resist layer exposes at least a portion of the protruding portion. A lower solder resist layer is disposed below the first conductive layer. The semiconductor chip may be electrically connected to the protruding portion of the first conductive layer through chip bumps.

According to exemplary embodiments of the present inventive concept, a printed circuit board includes a first conductive layer including a first region and a second region surrounding the first region. A core layer is disposed on the first conductive layer. A second conductive layer is disposed on the core layer. The second conductive layer vertically overlaps the second regions of the first conductive layer. The second conductive layer includes an opening exposing the first region of the first conductive layer. An upper solder resist layer is disposed on the second conductive layer. A lower solder resist layer is disposed on the first conductive layer. Protruding pads are disposed on the first region of the first conductive layer. The protruding pads penetrate the core layer and the upper solder resist layer.

BRIEF DESCRIPTION OF THE DRAWINGS

The above and other features of the present inventive concept will become more apparent by describing in detail exemplary embodiments thereof, with reference to the accompanying drawings in which:

FIGS. 13A through 13H are sectional views illustrating methods of forming the printed circuit board and the semiconductor packages according to exemplary embodiments of the present inventive concept.

FIGS. 14A through 14I are sectional views illustrating methods of forming the printed circuit board and the semiconductor packages according to exemplary embodiments of the present inventive concept.

FIGS. 15A through 15G are sectional views illustrating methods of forming the printed circuit board and the semiconductor packages according to exemplary embodiments of the present inventive concept.

FIGS. 16A through 16H are sectional views illustrating methods of forming the printed circuit board and the semiconductor packages according to exemplary embodiments of the present inventive concept.

DETAILED DESCRIPTION

Figure 1:
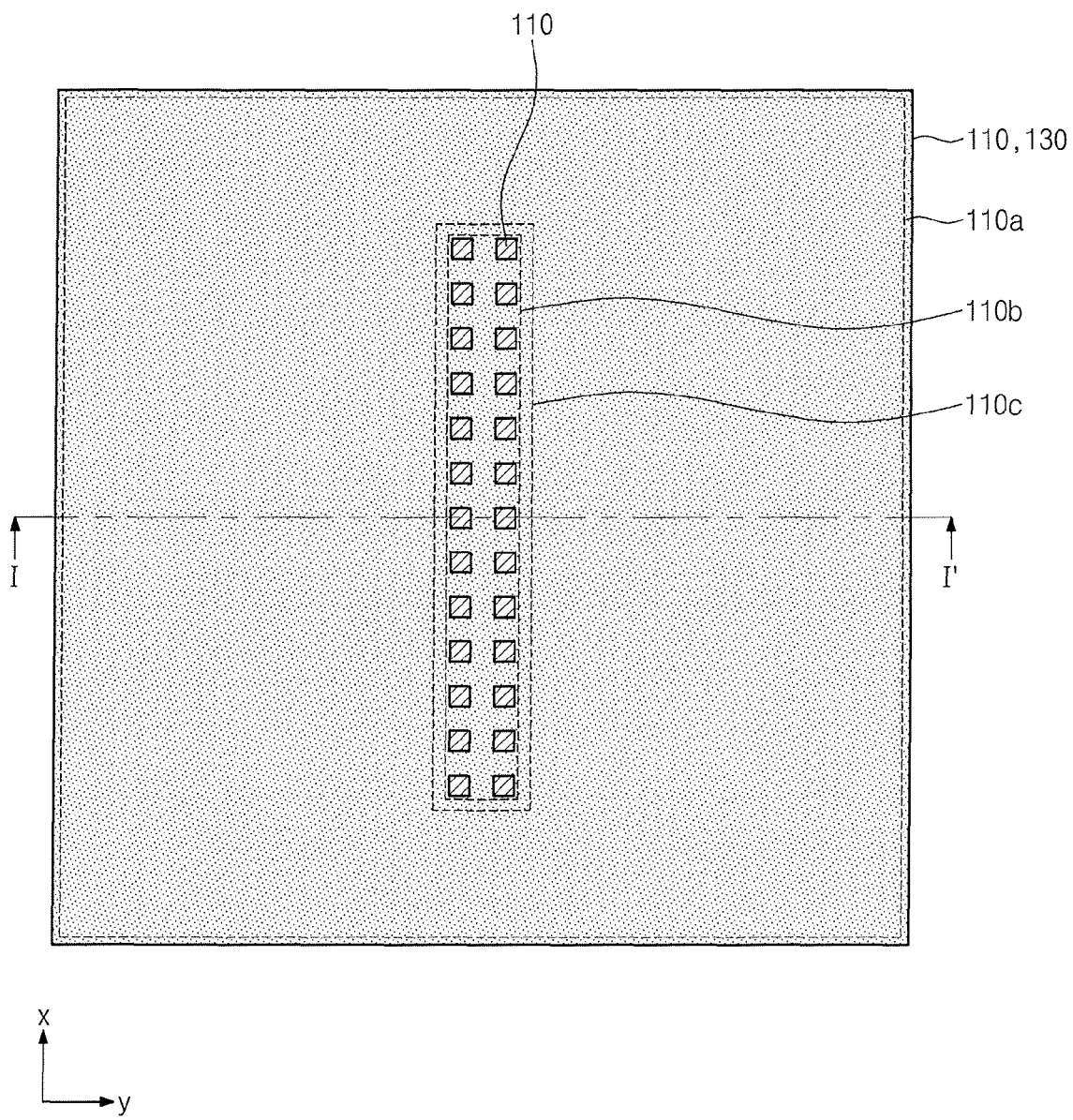
FIG. 1 is a plan view illustrating a printed circuit board according to exemplary embodiments of the present inventive concept.

Exemplary embodiments of the present inventive concept will now be described more fully with reference to the accompanying drawings, in which exemplary embodiments are shown. Exemplary embodiments of the present inventive concept may, however, be embodied in many different forms and should not be construed as being limited to the embodiments set forth herein. In the drawings, the thicknesses of layers and/or regions may be exaggerated for clarity. Like reference numerals in the specification and drawings may refer to like elements, and thus duplicative descriptions may be omitted.

These drawings might not be to scale and might not precisely reflect the precise structural or performance characteristics of an exemplary embodiment of the present inventive concept, and should not be interpreted as defining or limiting the range of values or properties encompassed by exemplary embodiments of the present inventive concept.

It will be understood that when an element is referred to as being "connected" or "coupled" to another element, it may be directly connected or coupled to the other element or intervening elements may be present.

It will be understood that, although the terms "first" and "second" may be used herein to describe various elements, components, regions, layers and/or sections, these elements, components, regions, layers and/or sections should not be limited by these terms.

Spatially relative terms, such as "beneath," "below," "lower," "above," "upper" and the like, may be used herein in the specification and drawings to describe one element or feature's relationship to another element or feature. It will be understood that the spatially relative terms are intended to encompass different orientations of the device in use or operation in addition to the orientation depicted in the specification and drawings.

The terminology used herein is for the purpose of describing particular exemplary embodiments of the present inventive concept and is not intended to be limiting to particular exemplary embodiments.

Figure 2:
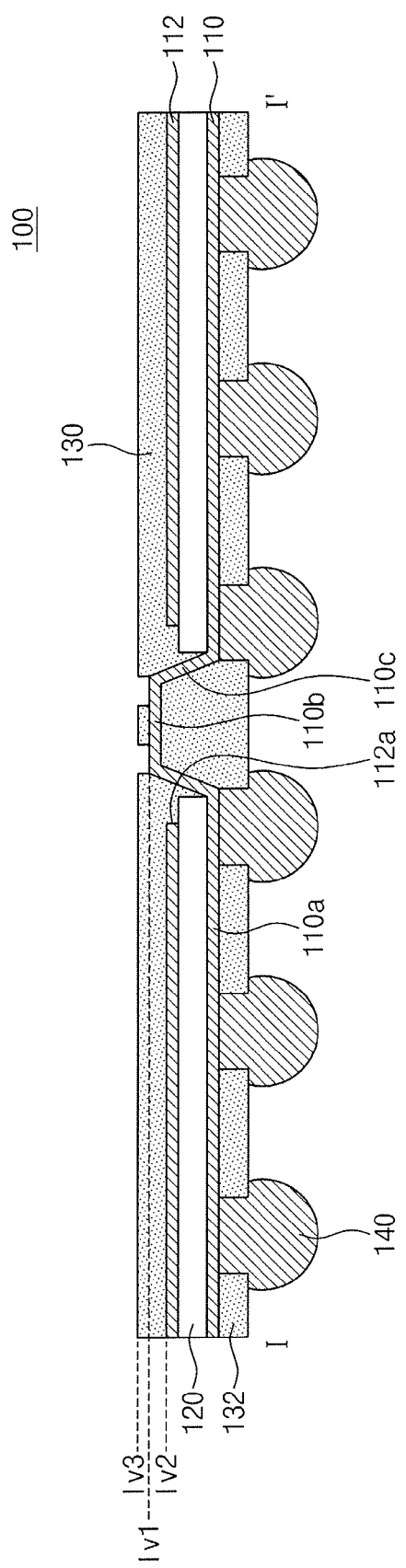
FIG. 2 is a sectional view taken along line I-I' of FIG. 1 illustrating a printed circuit board according to an exemplary embodiment of the present inventive concept.

FIG. 1 is a plan view illustrating a printed circuit board according to exemplary embodiments of the present inventive concept. FIG. 2 is a sectional view taken along line I-I' of FIG. 1 illustrating a printed circuit board according to an exemplary embodiment of the present inventive concept. Hereinafter, a printed circuit board according to an exemplary embodiment of the present inventive concept will be described in more detail with reference to FIGS. 1 and 2.

Referring to FIGS. 1 and 2, a printed circuit board 100 may include a first conductive layer 110, a second conductive layer 112, a core layer 120, an upper solder resist layer 130, a lower solder resist layer 132, and outer connection solder balls 140.

The first conductive layer 110 may include a recessed portion 110a, a protruding portion 110b disposed at a higher level than that of the recessed portion 110a, and a connecting portion 110c connecting the recessed portion 110a with the protruding portion 110b. When viewed in a sectional view, the protruding portion 110b and the recessed portion 110a may be parallel to each other. A level 1v1 of a top surface of the protruding portion 110b may be equal to or higher than a level 1v2 of a top surface of the second conductive layer 112 and may be equal to or lower than a level 1v3 of a top surface of the upper solder resist layer 130. The connecting portion 110c may connect the recessed and protruding portions 110a and 110b. The recessed and protruding portions 110a and 110b may be disposed at different levels from each other. The connecting portion 110c may be disposed at an angle with respect to the top surface of the recessed portion 110a and/or the protruding portion 110b (see, e.g., FIG. 2), but exemplary embodiments of the present inventive concept are not be limited thereto. For example, the connecting portion 110c may be perpendicular to the recessed portion 110a and the protruding portion 110b. When viewed in a plan view, the protruding portion 110b may be disposed in a central region of the printed circuit board 100, the connecting portion 110c may enclose the protruding portion 110b, and the recessed portion 110a may enclose the protruding portion 110b. The first conductive layer 110 may include at least one metallic material (e.g., copper (Cu), aluminum (Al), nickel (Ni), iron (Fe), tungsten (W), silver (Ag), or gold (Au)) or alloys thereof.

The second conductive layer 112 may be disposed on the first conductive layer 110. The second conductive layer 112 may vertically overlap the recessed portion 110a, but need not vertically overlap the protruding portion 110b, thereby exposing the protruding portion 110b. The second conductive layer 112 may have an opening 112a exposing the protruding portion 110b. In the printed circuit board 100 according to an exemplary embodiment of the present inventive concept, the second conductive layer 112 need not be electrically connected to the first conductive layer 110.

When a semiconductor chip is mounted on the printed circuit board 100, the semiconductor chip may be directly connected to the protruding portion 110b of the first conductive layer 110. For example, the semiconductor chip may be directly connected to the protruding portion 110b of the first conductive layer 110, in a flip-chip manner, through chip bumps disposed on the protruding portion 110b. The first conductive layer 110 may include a wiring pattern, and electrical signals generated by the semiconductor chip may be transmitted to the recessed portion 110a of the first conductive layer 110 and the outer connection solder balls 140 through the wiring pattern. Electrical signals input through the outer connection solder balls 140 may be transmitted to the semiconductor chip through the wiring pattern of the first conductive layer 110.

The second conductive layer 112 need not be connected to the first conductive layer 110. The second conductive layer 112 may include a pattern that includes the same material as a wiring pattern of the recessed portion 110b of the first conductive layer 110 and has the same or similar shape as the wiring pattern of the recessed portion 110. This may allow top and bottom portions of the printed circuit board 100 to have substantially equivalent thermal expansion coefficients, and thus an occurrence of warpage may be reduced or prevented in the printed circuit board 100 when there is a change in temperature. According to an exemplary embodiment of the present inventive concept, the second conductive layer 112 may be used as a heat-dissipation layer. In such an embodiment, the conductive layer 112 may be connected to the semiconductor chip mounted on the printed circuit board 100 and may dissipate heat generated in the semiconductor chip.

The core layer 120 may be disposed between the first conductive layer 110 and the second conductive layer 112. The second conductive layer 112 may cover the recessed portion 110a and may expose the protruding portion 110b. The core layer 120 may also cover the recessed portion 110a and expose the protruding portion 110b. In the printed circuit board 100 according to an exemplary embodiment of the present inventive concept, the core layer 120 may isolate the first conductive layer 110 electrically from the second conductive layer 112. The core layer 120 may include an insulating material (e.g., a glass fabric, polypropyleneglycol (PPG), or an insulating resin).

The upper solder resist layer 130 may cover the second conductive layer 112. The upper solder resist layer 130 may expose at least a portion of the protruding portion 110b exposed by the second conductive layer 112 and the core layer 120. For example, as shown in FIGS. 1 and 2, the upper solder resist layer 130 may expose regions on which chip bumps are disposed; however, exemplary embodiments of the present inventive concept are not limited thereto. For example, the upper solder resist layer 130 may expose the whole top surface of the protruding portion 110b. When the core layer 120 is partially exposed by the second conductive layer 112, the upper solder resist layer 130 may cover the exposed portion of the core layer 120. When the recessed portion 110a and the connecting portion 110c are partially exposed by the core layer 120, the upper solder resist layer 130 may cover the exposed portions of the recessed portion 110a and the connecting portion 110c.

The lower solder resist layer 132 may cover a bottom surface of the lowermost of the conductive layers. For example, the lower solder resist layer 132 may cover the bottom surface of the first conductive layer 110. The lower solder resist layer 132 may have openings, each of which exposes the recessed portion 110a of the first conductive layer 110.

The outer connection solder balls 140 may fill the openings, respectively, of the lower solder resist layer 132. The outer connection solder balls 140 may be electrically connected to the first conductive layer 110 through the openings.

Figure 3:
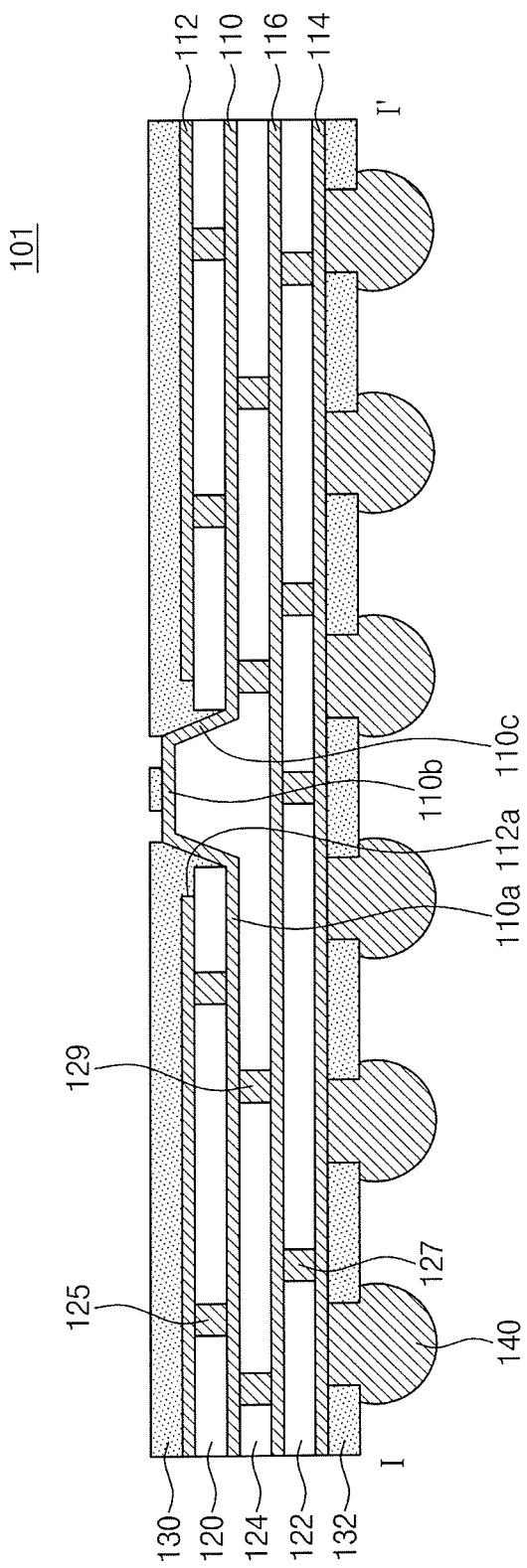
FIG. 3 is a sectional view taken along line I-I' of FIG. 1 illustrating a printed circuit board according to an exemplary embodiment of the present inventive concept.

FIG. 3 is a sectional view taken along line I-I' of FIG. 1 illustrating a printed circuit board according to an exemplary embodiment of the present inventive concept. Hereinafter, a printed circuit board according to an exemplary embodiment of the present inventive concept will be described with reference to FIGS. 1 and 3. Elements previously described with reference to FIGS. 1 and 2 may be identified by a similar or identical reference number and duplicative descriptions may be omitted.

Referring to FIGS. 1 and 3, a printed circuit board 101 may include the first conductive layer 110, the second conductive layer 112, a third conductive layer 114, a fourth conductive layer 116, the core layer 120, a first insulating layer 122, a second insulating layer 124, first through wires 125, second through wires 127, third through wires 129, the upper solder resist layer 130, the lower solder resist layer 132, and the outer connection solder balls 140.

The first and second conductive layers 110 and 112 may be configured in such a way that some of the wiring patterns thereof are electrically connected to each other through the first through wires 125, and except for this feature, they may be substantially the same as the first conductive layer (e.g., the first conductive layer 110 of FIG. 2) and the second conductive layer (e.g., the second conductive layer 112 of FIG. 2) according to the above described exemplary embodiments of the present inventive concept.

The third conductive layer 114 may be disposed below the first conductive layer 110, and the fourth conductive layer 116 may be disposed between the first conductive layer 110 and the third conductive layer 114. The third and fourth conductive layers 114 and 116 may include a metallic material (e.g., copper (Cu), aluminum (Al), nickel (Ni), iron (Fe), tungsten (W), silver (Ag), or gold (Au)) or alloys thereof.

The core layer 120 may be substantially the same as the core layer (e.g., the core layer 120 of FIG. 2) according to the above described exemplary embodiments of the present inventive concept.

The first insulating layer 122 may be disposed between the third conductive layer 114 and the fourth conductive layer 116. The second insulating layer 124 may be disposed between the first conductive layer 110 and the fourth conductive layer 116. The first and second insulating layers 122 and 124 may include an insulating material (e.g., a glass fabric, polypropyleneglycol (PPG), or an insulating resin).

The first through wires 125 may penetrate the core layer 120 and may connect some of the wiring patterns, which are included in the first and second conductive layers 110 and 112, to each other. The second through wires 127 may penetrate the first insulating layer 122 and may connect some of the wiring patterns, which are included in the third and fourth conductive layers 114 and 116, to each other. The third through wires 129 may penetrate the second insulating layer 124 and may connect some of the wiring patterns included in the first and fourth conductive layers 110 and 116 to each other.

When the semiconductor chip is mounted on the printed circuit board 101, the semiconductor chip may be directly connected to the protruding portion 110b of the first conductive layer 110. For example, the semiconductor chip may be directly connected to the protruding portion 110b of the first conductive layer 110, in a flip-chip manner, through chip bumps disposed on the protruding portion 110b. Accordingly, the first conductive layer 110 may be connected to signal pads of the semiconductor chip, thereby serving as a signal layer for transmitting electrical signals. The second conductive layer 112 may be connected to power (or ground) pads of the semiconductor chip through the first conductive layer 110 and the first through wires 125, and thus, the second conductive layer 112 may be used as a power (or ground) layer. The fourth conductive layer 116 may be connected to the ground (or power) pads of the semiconductor chip through the first conductive layer 110 and third through wires 129, and thus, the fourth conductive layer 116 may be used as a ground (or power) layer. In this case, the first, second, and fourth conductive layers 110, 112, and 116 may constitute a strip line structure, in which the signal layer is disposed between the ground and power layers, and thus, distortion of electrical signals transmitted through the first conductive layer 110 may be reduced or eliminated.

The upper solder resist layer 130 may be substantially the same as the upper solder resist layer (e.g., the upper solder resist layer 130 of FIG. 2) according to the above described exemplary embodiments of the present inventive concept.

The lower solder resist layer 132 may cover the bottom surface of the lowermost of the conductive layers. For example, the lower solder resist layer 132 may cover the bottom surface of the third conductive layer 114. The lower solder resist layer 132 may have openings, each of which exposes a portion of the third conductive layer 114.

The outer connection solder balls 140 may fill the openings, respectively, of the lower solder resist layer 132. The outer connection solder balls 140 may be electrically connected to the third conductive layer 114 through the openings.

Figure 4:
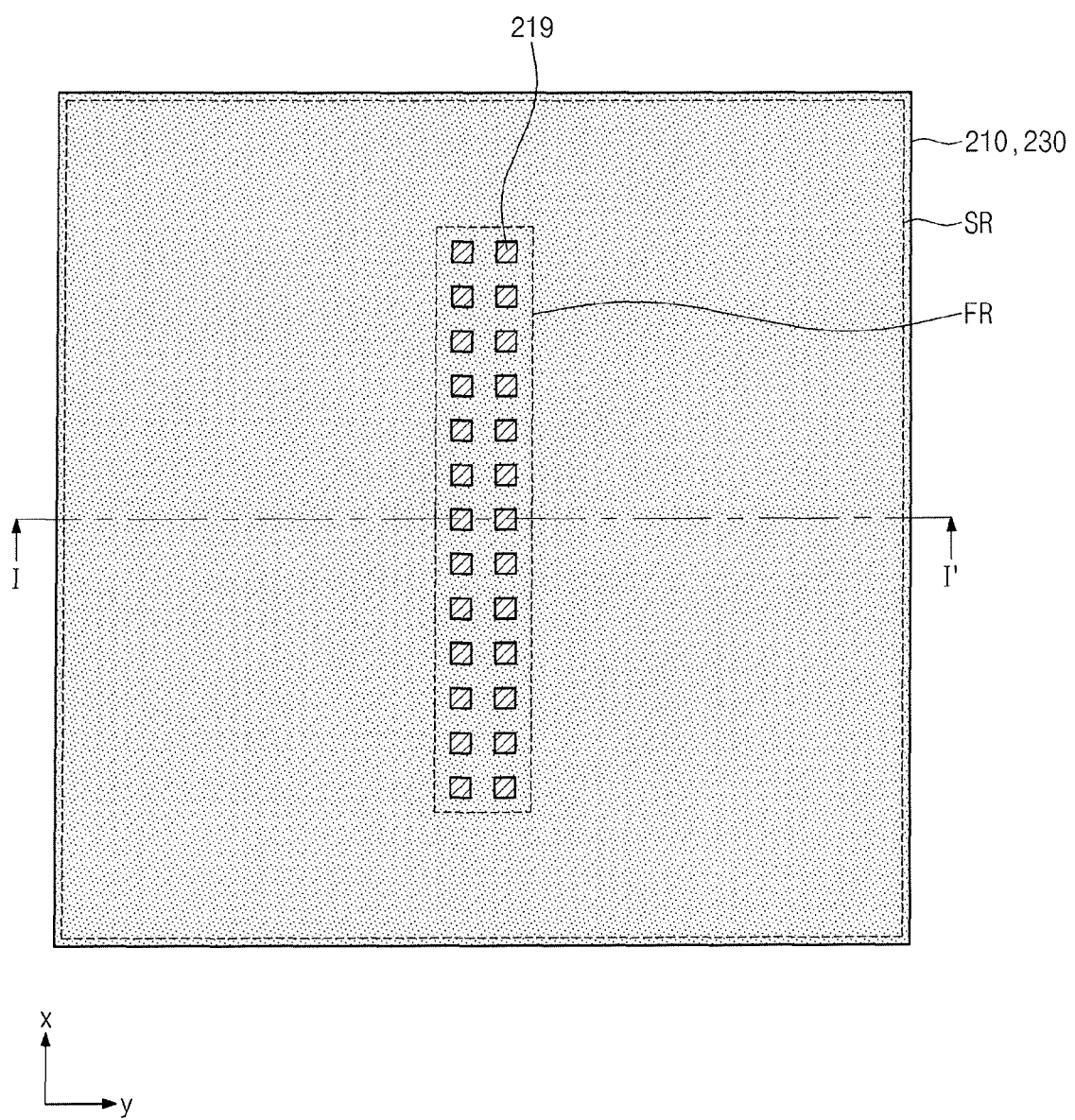
FIG. 4 is a plan view illustrating a printed circuit board according to an exemplary embodiment of the present inventive concept.
Figure 5:
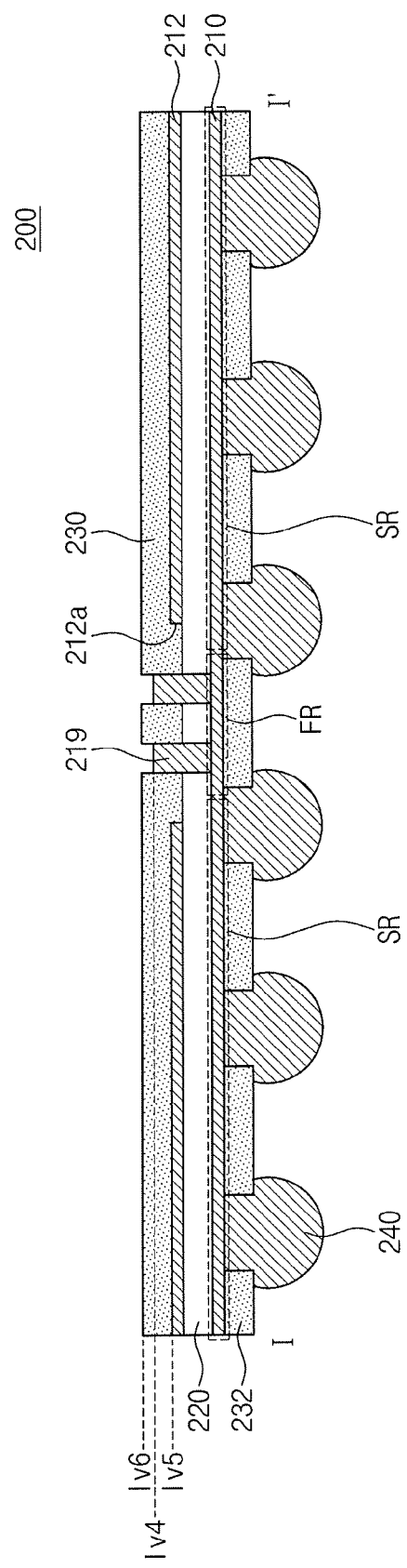
FIG. 5 is a sectional view taken along line I-I' of FIG. 4 illustrating a printed circuit board according to an exemplary embodiment of the present inventive concept.

FIG. 4 is a plan view illustrating a printed circuit board according to exemplary embodiments of the present inventive concept. FIG. 5 is a sectional view taken along line I-I' of FIG. 4 illustrating a printed circuit board according to an exemplary embodiment of the present inventive concept. Hereinafter, a printed circuit board according to an exemplary embodiment of the present inventive concept will be described in more detail with reference to FIGS. 4 and 5.

Referring to FIGS. 4 and 5, a printed circuit board 200 may include a first conductive layer 210, a second conductive layer 212, protruding pads 219, a core layer 220, an upper solder resist layer 230, a lower solder resist layer 232, and outer connection solder balls 240.

The first conductive layer 210 may include a first region FR and a second region SR surrounding the first region FR. The protruding pads 219 may be disposed on the first region FR and may be in contact with the first conductive layer 210. A level lv4 of a top surface of the protruding pads 219 may be equal to or higher than a level lv5 of a top surface of the second conductive layer 212. The level lv4 of the top surface of the protruding pads 219 may be equal to or lower than a level lv6 of a top surface of the upper solder resist layer 230. When viewed in a plan view, the first region FR may be disposed in a central region of the printed circuit board 200 and the second region SR may enclose the first region FR. The first conductive layer 210 may include at least one metallic material (e.g., copper (Cu), aluminum (Al), nickel (Ni), iron (Fe), tungsten (W), silver (Ag), or gold (Au)) or alloys thereof.

The second conductive layer 212 may be disposed on the first conductive layer 210. The second conductive layer 212 may vertically overlap the second region SR, but need not vertically overlap the first region FR, thereby exposing the first region FR. The second conductive layer 212 may have an opening 212a exposing the first region FR. The opening 212a of the second conductive layer 212 may expose the protruding pads 219. In the printed circuit board 200 according to an exemplary embodiment of the present inventive concept, the second conductive layer 212 need not be electrically connected to the first conductive layer 210 and the protruding pads 219.

When the semiconductor chip is mounted on the printed circuit board 200, the semiconductor chip may be directly connected to the protruding pads 219. For example, the semiconductor chip may be directly connected to the protruding pads 219, in a flip-chip manner, through chip bumps disposed on the protruding pads 219, and thus, the semiconductor chip may be connected to the first conductive layer 210. The first conductive layer 210 may include a wiring pattern, and electrical signals generated by the semiconductor chip may be transmitted to the outer connection solder balls 240 through the chip bumps, the protruding pads 219, and the wiring pattern. Electrical signals input through the outer connection solder balls 240 may be transmitted to the semiconductor chip through the wiring pattern, the protruding pads 219, and the chip bumps.

The second conductive layer 212 need not be connected to the first conductive layer 210. The second conductive layer 212 may include a pattern including a same material included in a wiring pattern of the second region SR of the first conductive layer 210 and may have a same or similar shape as the wiring pattern of the second region SR of the first conductive layer 210. This may allow top and bottom portions of the printed circuit board 200 to have substantially equivalent thermal expansion coefficients, and thus, an occurrence of warpage may be reduced or prevented in the printed circuit board 200, when there is a change in temperature. The second conductive layer 212 may be used as a heat-dissipation layer, which is connected to the semiconductor chip mounted on the printed circuit board 200 to dissipate heat generated in the semiconductor chip.

The core layer 220 may be disposed between the first conductive layer 210 and the second conductive layer 212. The core layer 220 may be penetrated by the protruding pads 219. In the printed circuit board 200 according to an exemplary embodiment of the present inventive concept, the core layer 220 may electrically separate the first conductive layer 210 from the second conductive layer 212. The core layer 220 may include an insulating material (e.g., a glass fabric, polypropyleneglycol (PPG), or an insulating resin).

The upper solder resist layer 230 may cover the second conductive layer 212. The upper solder resist layer 230 may partially expose the top surfaces of the protruding pads 219, which are not covered with the core layer 220. When the core layer 220 is partially exposed by the second conductive layer 212, the upper solder resist layer 230 may cover the exposed portion of the core layer 220.

The lower solder resist layer 232 may cover a bottom surface of the lowermost of the conductive layers. For example, the lower solder resist layer 232 may cover the bottom surface of the first conductive layer 210. The lower solder resist layer 232 may include openings, each of which may expose a portion of the first conductive layer 210.

The outer connection solder balls 240 may fill the openings, respectively, of the lower solder resist layer 232. The outer connection solder balls 240 may be electrically connected to the first conductive layer 210 through the openings.

Figure 6:
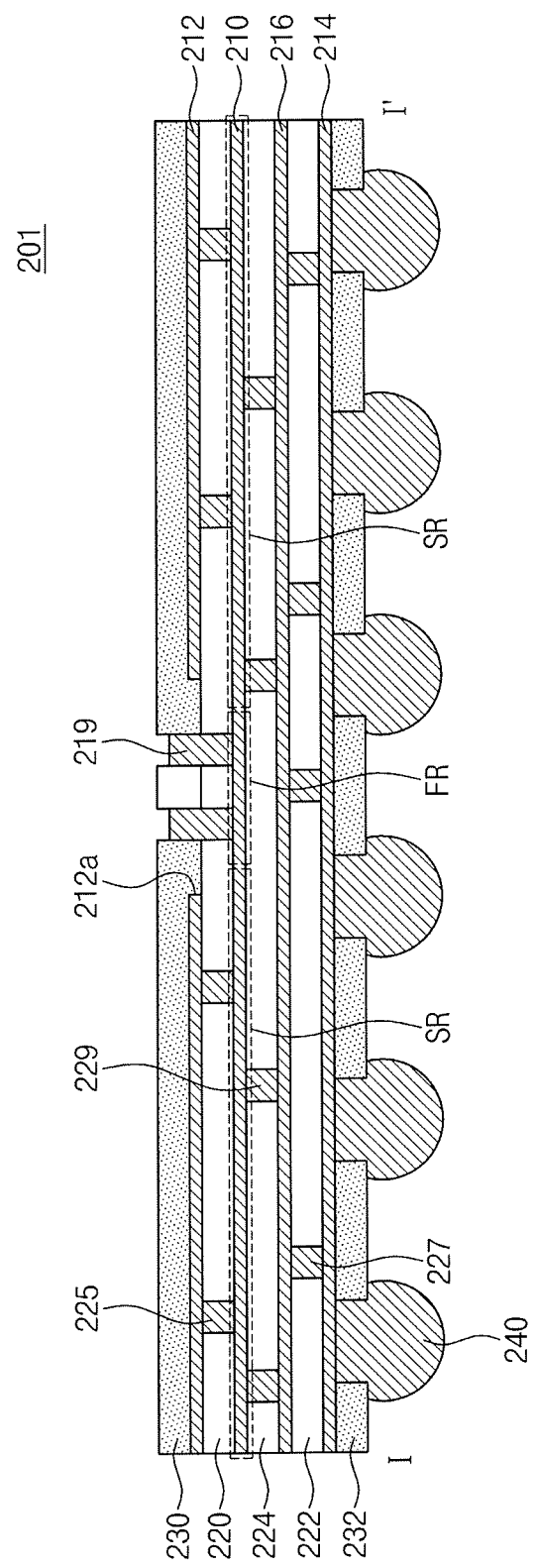
FIG. 6 is a sectional view taken along line I-I' of FIG. 4 illustrating a printed circuit board according to an exemplary embodiment of the present inventive concept.

FIG. 6 is a sectional view taken along line I-I' of FIG. 4 illustrating a printed circuit board according to an exemplary embodiment of the present inventive concept. Hereinafter, a printed circuit board according to an exemplary embodiment of the present inventive concept will be described in more detail with reference to FIGS. 4 and 6. For concise description, an element previously described with reference to FIGS. 4 and 5 may be identified by a similar or identical reference number and duplicative descriptions may be omitted.

Referring to FIGS. 4 and 6, a printed circuit board 201 may include the first conductive layer 210, the second conductive layer 212, a third conductive layer 214, a fourth conductive layer 216, a protruding pads 219, the core layer 220, a first insulating layer 222, a second insulating layer 224, first through wires 225, second through wires 227, third through wires 229, an upper solder resist layer 230, the lower solder resist layer 232, and the outer connection solder balls 240.

The first and second conductive layers 210 and 212 may be electrically connected to each other, and except for this feature, they may be substantially the same as the first conductive layer (e.g., the first conductive layer 210 of FIG. 5) and the second conductive layer (e.g., the second conductive layer 212 of FIG. 5) according to the above described exemplary embodiments of the present inventive concept. The protruding pads 219 may be substantially the same as the protruding pads (e.g., the protruding pad 219 of FIG. 5) according to the above described exemplary embodiments of the present inventive concept.

The third conductive layer 214 may be disposed below the first conductive layer 210, and the fourth conductive layer 216 may be disposed between the first conductive layer 210 and the third conductive layer 214. The third and fourth conductive layers 214 and 216 may include at least one metallic material (e.g., copper (Cu), aluminum (Al), nickel (Ni), iron (Fe), tungsten (W), silver (Ag), or gold (Au)) or alloys thereof.

The core layer 220 may be substantially the same as the core layer (e.g., the core layer 220 of FIG. 5) according to the above described exemplary embodiments of the present inventive concept.

The first insulating layer 222 may be disposed between the third conductive layer 214 and the fourth conductive layer 216. The second insulating layer 224 may be disposed between the first conductive layer 210 and the fourth conductive layer 216. The first and second insulating layers 222 and 224 may include an insulating material (e.g., a glass fabric, polypropyleneglycol (PPG), or an insulating resin).

The first through wires 225 may penetrate the core layer 220 and may connect some of wiring patterns, which are included in the first and second conductive layers 210 and 212, to each other. The second through wires 227 may penetrate the first insulating layer 222 and may connect some of wiring patterns, which are included in the third and fourth conductive layers 214 and 216, to each other. The third through wires 229 may penetrate the second insulating layer 224 and may connect some of wiring patterns, which are included in the first and fourth conductive layers 210 and 216, to each other.

When the semiconductor chip is mounted on the printed circuit board 200, the semiconductor chip may be directly connected to the first conductive layer 210 through the protruding pads 219. For example, the semiconductor chip may be directly connected to the first conductive layer 210, in a flip-chip manner, through chip bumps on the protruding pads 219. Accordingly, the first conductive layer 210 may be connected to signal pads of the semiconductor chip, thereby serving as a signal layer for transmitting electrical signals. The second conductive layer 212 may be connected to power (or ground) pads of the semiconductor chip through the first conductive layer 210 and the first through wires 225, and thus, it may be used as a power (or ground) layer. The fourth conductive layer 216 may be connected to the ground (or power) pads of the semiconductor chip through the first conductive layer 210 and the third through wires 229, and thus, it may be used as a ground (or power) layer. The first, second, and fourth conductive layers 210, 212, and 216 may constitute a strip line structure, in which the signal layer is disposed between the ground and power layers, and thus, it may be possible to reduce or prevent distortion of electrical signals to be transmitted through the first conductive layer 210.

The upper solder resist layer 230 may be substantially the same as the upper solder resist layer (e.g., the upper solder resist layer 230 of FIG. 5) according to the above described exemplary embodiments of the present inventive concept.

The lower solder resist layer 232 may cover a bottom surface of the lowermost of the conductive layers. For example, the lower solder resist layer 232 cover the bottom surface of the third conductive layer 214. The lower solder resist layer 232 may include openings, each of which exposes a portion of the third conductive layer 214.

The outer connection solder balls 240 may fill the openings, respectively, of the lower solder resist layer 232. The outer connection solder balls 240 may be electrically connected to the third conductive layer 214 through the openings.

Figure 7:
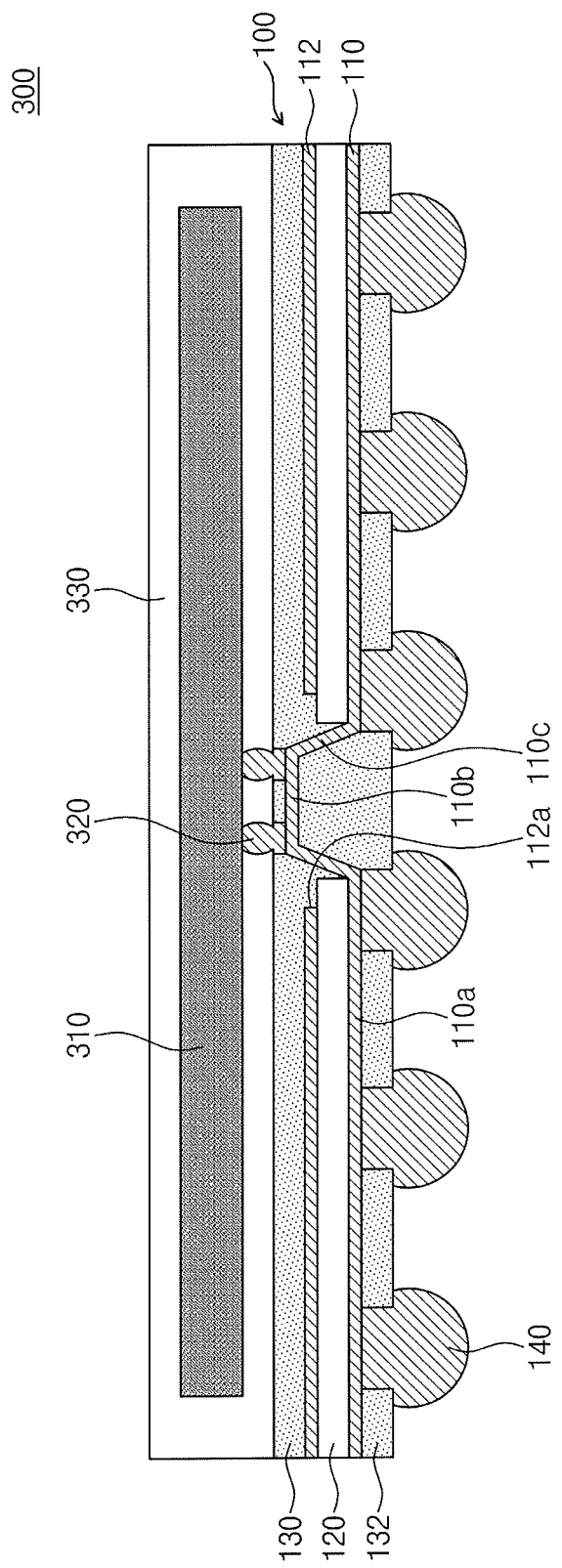
FIG. 7 is a sectional view taken along line I-I' of FIG. 1 illustrating a semiconductor package according to an exemplary embodiment of the present inventive concept.

FIG. 7 is a sectional view taken along line I-I' of FIG. 1 illustrating a semiconductor package according to an exemplary embodiment of the present inventive concept. A semiconductor package according to an exemplary embodiment of the present inventive concept may include the printed circuit board (e.g., the printed circuit board 100 of FIG. 2) according to the above described exemplary embodiments of the present inventive concept. Hereinafter, a semiconductor package according to an exemplary embodiment of the present inventive concept will be described in more detail with reference to FIG. 7.

Referring to FIG. 7, a semiconductor package 300 may include the printed circuit board 100, a semiconductor chip 310, chip bumps 320, and a mold layer 330. The printed circuit board 100 may have substantially the same features as those of the printed circuit board (e.g., the printed circuit board 100 of FIG. 2) according to according to the above described exemplary embodiments of the present inventive concept. Thus, duplicative descriptions of the printed circuit board 100 may be omitted below.

The semiconductor chip 310 may be mounted on the printed circuit board 100. The chip bumps 320 may be disposed on the protruding portion 110b of the first conductive layer 110. The chip bumps 320 may electrically connect the semiconductor chip 310 to the first conductive layer 110. For example, the semiconductor chip 310 may be directly connected to the protruding portion 110b of the first conductive layer 110, in a flip-chip manner, through the chip bumps 320 disposed on the protruding portion 110b. The first conductive layer 110 may include wiring patterns, and thus, electrical signals generated by the semiconductor chip 310 may be transmitted to the recessed portion 110a of the first conductive layer 110 and the outer connection solder balls 140 through the chip bumps 320 and the wiring pattern. Similarly, electrical signals input through the outer connection solder balls 140 may be transmitted to the semiconductor chip 310 through the wiring pattern of the first conductive layer 110 and the chip bumps 320.

The second conductive layer 112 need not be connected to the first conductive layer 110. The second conductive layer 112 may include a pattern that is formed of the same material as the wiring pattern of the recessed portion 110b of the first conductive layer 110 and may have the same or similar shape as the wiring pattern of the recessed portion 110b. This may allow top and bottom portions of the printed circuit board 100 to have substantially equivalent thermal expansion coefficients, and thus, it may be possible to reduce or prevent warpage from occurring in the printed circuit board 100, when there is a change in temperature.

The mold layer 330 may encapsulate the semiconductor chip 310. In other words, the mold layer 330 may cover the semiconductor chip 310 and the top surface of the printed circuit board 100 and may fill gap regions between the semiconductor chip 310 and the printed circuit board 100, and between the chip bumps 320. The mold layer 330 may include an epoxy molding compound.

Figure 8:
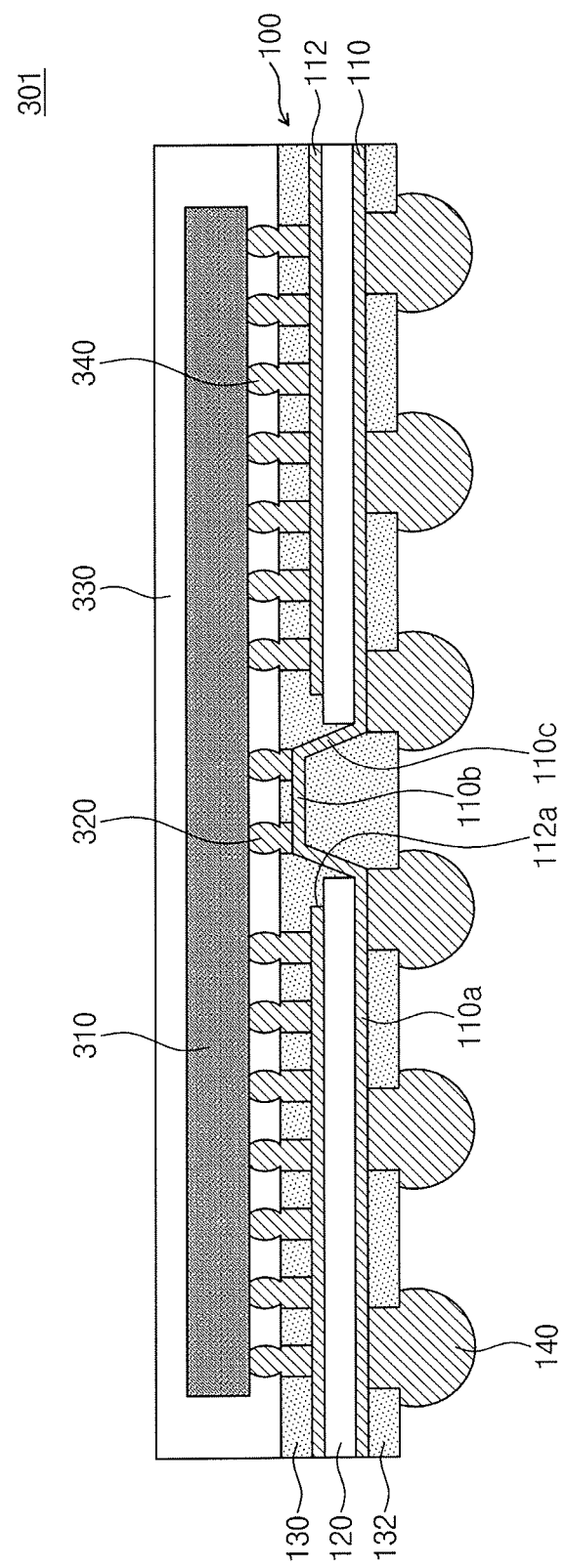
FIG. 8 is a sectional view taken along line I-I' of FIG. 1 illustrating a semiconductor package according to an exemplary embodiment of the present inventive concept.

FIG. 8 is a sectional view taken along line I-I' of FIG. 1 illustrating a semiconductor package according to an exemplary embodiment of the present inventive concept. A semiconductor package according to an exemplary embodiment of the present inventive concept may include the printed circuit board (e.g., the printed circuit board 100 of FIG. 2) according to the above described exemplary embodiments of the present inventive concept. Hereinafter, a semiconductor package according to an exemplary embodiment of the present inventive concept will be described in more detail with reference to FIG. 8.

Referring to FIG. 8, a semiconductor package 301 may include the printed circuit board 100, the semiconductor chip 310, the chip bumps 320, the mold layer 330, and heat-dissipation bumps 340. Elements of the semiconductor package 301, other than the second conductive layer 112 and the heat-dissipation bumps 340 may be substantially the same as those of the semiconductor package 300 of FIG. 7. Thus, duplicative descriptions of the other elements may be omitted below.

The heat-dissipation bumps 340 may be disposed on the top surface of the second conductive layer 112 and may be in contact with the second conductive layer 112. The heat-dissipation bumps 340 may penetrate the upper solder resist layer 130 and may be in contact with the semiconductor chip 310. Accordingly, heat generated in the semiconductor chip 310 may be dissipated to the second conductive layer 112 through the heat-dissipation bumps 340. According to exemplary embodiments of the present inventive concept, the heat-dissipation bumps 340 may include a material having a thermal conductivity higher than that of air. For example, the heat-dissipation bumps 340 may include at least one metallic material (e.g., copper (Cu), aluminum (Al), nickel (Ni), iron (Fe), tungsten (W), silver (Ag), or gold (Au)) or alloys thereof.

The second conductive layer 112 may be connected to the heat-dissipation bumps 340 and may be used as a heat-dissipation layer for dissipate heat generated in the semiconductor chip 310 to the outside. For example, the second conductive layer 112 may have a flat plate shape. The second conductive layer 112 may include a pattern that includes a same material as the wiring pattern of the recessed portion 110b of the first conductive layer 110 and has the same or similar shape as the wiring pattern of the recessed portion 110b. The second conductive layer 112 may include a material having a thermal conductivity that is higher than that of air. For example, the second conductive layer 112 may include at least one metallic material (e.g., copper (Cu), aluminum (Al), nickel (Ni), iron (Fe), tungsten (W), silver (Ag), or gold (Au)) or alloys thereof.

According to an exemplary embodiment of the present inventive concept, the semiconductor package 301 may be configured to discharge heat generated in the semiconductor chip 310 to the second conductive layer 112. Thus, performance and stability of the semiconductor chip 310 may be increased.

Figure 9:
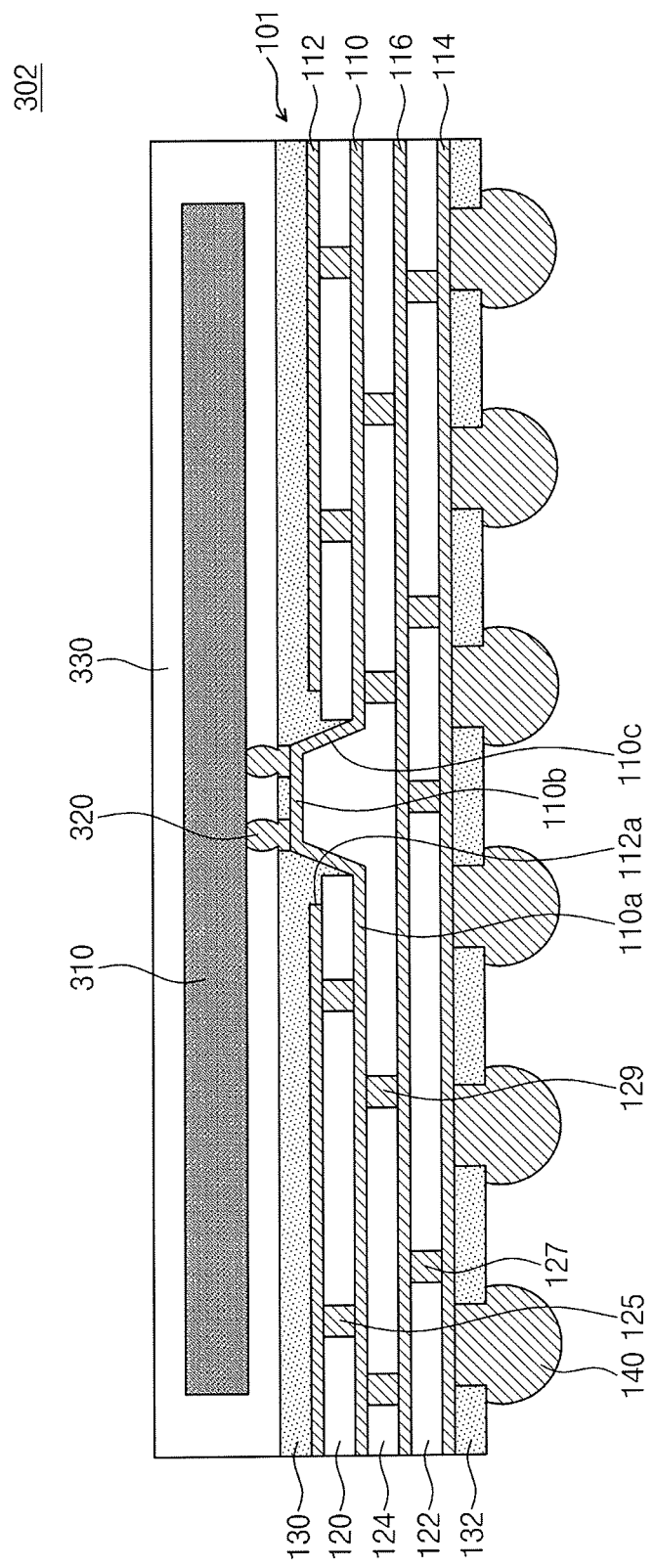
FIG. 9 is a sectional view taken along line I-I' of FIG. 1 illustrating a semiconductor package according to an exemplary embodiment of the present inventive concept.

FIG. 9 is a sectional view taken along line I-I' of FIG. 1 illustrating a semiconductor package according to an exemplary embodiment of the present inventive concept. A semiconductor package according to an exemplary embodiment of the present inventive concept may include the printed circuit board (e.g., the printed circuit board 101 of FIG. 3) according to the above described exemplary embodiments of the present inventive concept. Hereinafter, a semiconductor package according to an exemplary embodiment of the present inventive concept will be described in more detail with reference to FIG. 9.

Referring to FIG. 9, a semiconductor package 302 may include the printed circuit board 101, the semiconductor chip 310, chip bumps 320, and the mold layer 330. The printed circuit board 101 may be substantially the same as the printed circuit board 101 of FIG. 3. Thus, duplicative descriptions of the printed circuit board 101 may be omitted.

The semiconductor chip 310 may be mounted on the printed circuit board 101. The chip bumps 320 may be disposed on the protruding portion 110b of the first conductive layer 110. The chip bumps 320 may electrically connect the semiconductor chip 310 to the first conductive layer 110. For example, the semiconductor chip 310 may be directly connected to the protruding portion 110b of the first conductive layer 110, in a flip-chip manner, through the chip bumps 320 provided on the protruding portion 110b. Accordingly, the first conductive layer 110 may be connected to signal pads of the semiconductor chip 310, thereby serving as a signal layer for delivering electrical signals. The second conductive layer 112 may be connected to power (or ground) pads of the semiconductor chip 310 through the first conductive layer 110 and the first through wires 125, and thus, it may be used as a power (or ground) layer. The fourth conductive layer 116 may be connected to the ground (or power) pads of the semiconductor chip 310 through the first conductive layer 110 and the third through wires 129, and thus, it may be used as a ground (or power) layer. The first, second, and fourth conductive layers 110, 112, and 116 may constitute a strip line structure, in which the signal layer is disposed between the ground and power layers, and thus, it may be possible to reduce or eliminate distortion of electrical signals transmitted through the first conductive layer 110.

The mold layer 330 may encapsulate the semiconductor chip 310. In other words, the mold layer 330 may cover the semiconductor chip 310 and the top surface of the printed circuit board 101 and may fill gap regions between the semiconductor chip 310 and the printed circuit board 101 and between the chip bumps 320. The mold layer 330 may include an epoxy molding compound.

Figure 10:
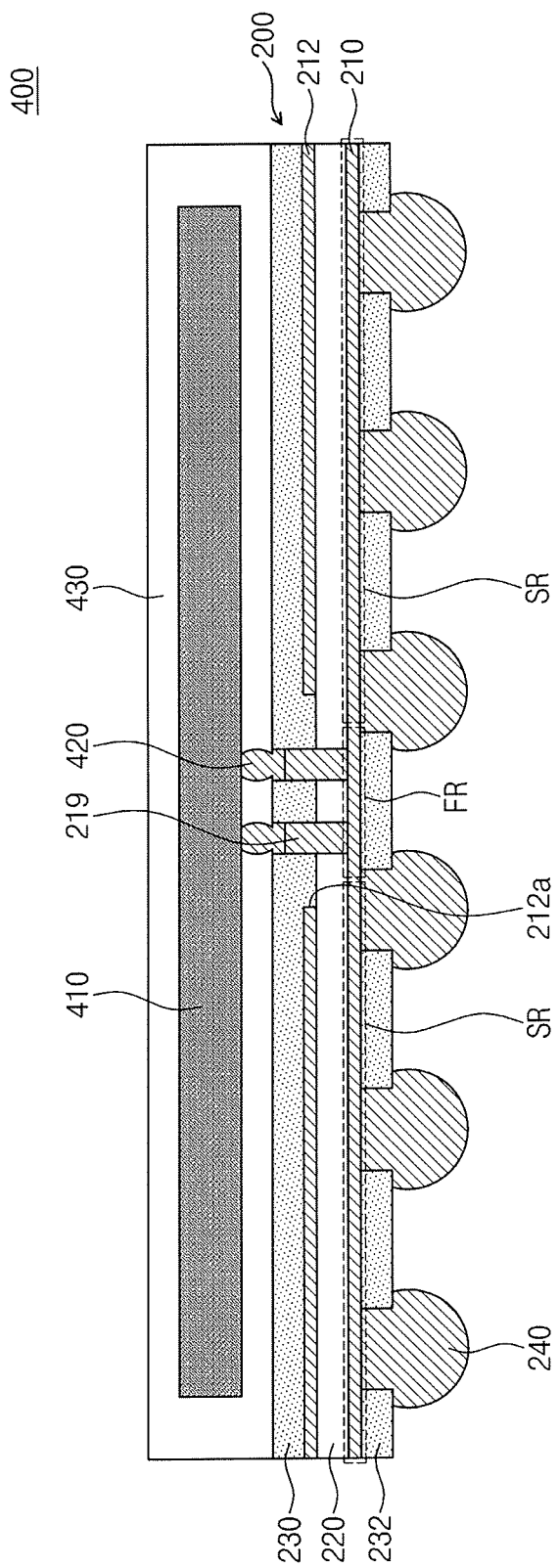
FIG. 10 is a sectional view taken along line I-I' of FIG. 4 illustrating a semiconductor package according to an exemplary embodiment of the present inventive concept.

FIG. 10 is a sectional view taken along line I-I' of FIG. 4 illustrating a semiconductor package according to an exemplary embodiment of the present inventive concept. A semiconductor package according to an exemplary embodiment of the present inventive concept may include the printed circuit board 200 of FIG. 5. Hereinafter, a semiconductor package according to an exemplary embodiment of the present inventive concept will be described in more detail with reference to FIG. 10.

Referring to FIG. 10, a semiconductor package 400 may include the printed circuit board 200, a semiconductor chip 410, chip bumps 420, and a mold layer 430. The printed circuit board 200 may be substantially the same as the printed circuit board 200 of FIG. 5. Thus, duplicative descriptions of the printed circuit board 200 may be omitted.

The semiconductor chip 410 may be mounted on the printed circuit board 200. The chip bumps 420 may be disposed on the protruding pads 219 and may electrically connect the semiconductor chip to the first conductive layer 210. For example, the semiconductor chip 410 may be connected to the first conductive layer 210, in a flip-chip manner, through the chip bumps 420 on the protruding pads 219. The first conductive layer 210 may include at least one wiring pattern, and electrical signals generated in the semiconductor chip 410 may be transmitted to the outer connection solder balls 240 through the chip bumps 420 and the wiring pattern of the first conductive layer 210. Similarly, electrical signals input through the outer connection solder balls 240 may be transmitted to the semiconductor chip 410 through the wiring pattern of the first conductive layer 210 and the chip bumps 420.

The second conductive layer 212 need not be connected to the first conductive layer 210. The second conductive layer 212 may include a pattern that includes a same material as the wiring pattern of the second region SR of the first conductive layer 210 and has the same or similar shape as the wiring pattern of the second region SR of the first conductive layer 210. This may allow top and bottom portions of the printed circuit board 200 to have substantially equivalent thermal expansion coefficients, and thus, it may be possible to reduce or prevent warpage from occurring in the printed circuit board 200, when there is a change in temperature.

The mold layer 430 may encapsulate the semiconductor chip 410. In other words, the mold layer 430 may cover the semiconductor chip 410 and the top surface of the printed circuit board 200 and may fill gap regions between the semiconductor chip 410 and the printed circuit board 200 and between the chip bumps 420. The mold layer 430 may include an epoxy molding compound.

Figure 11:
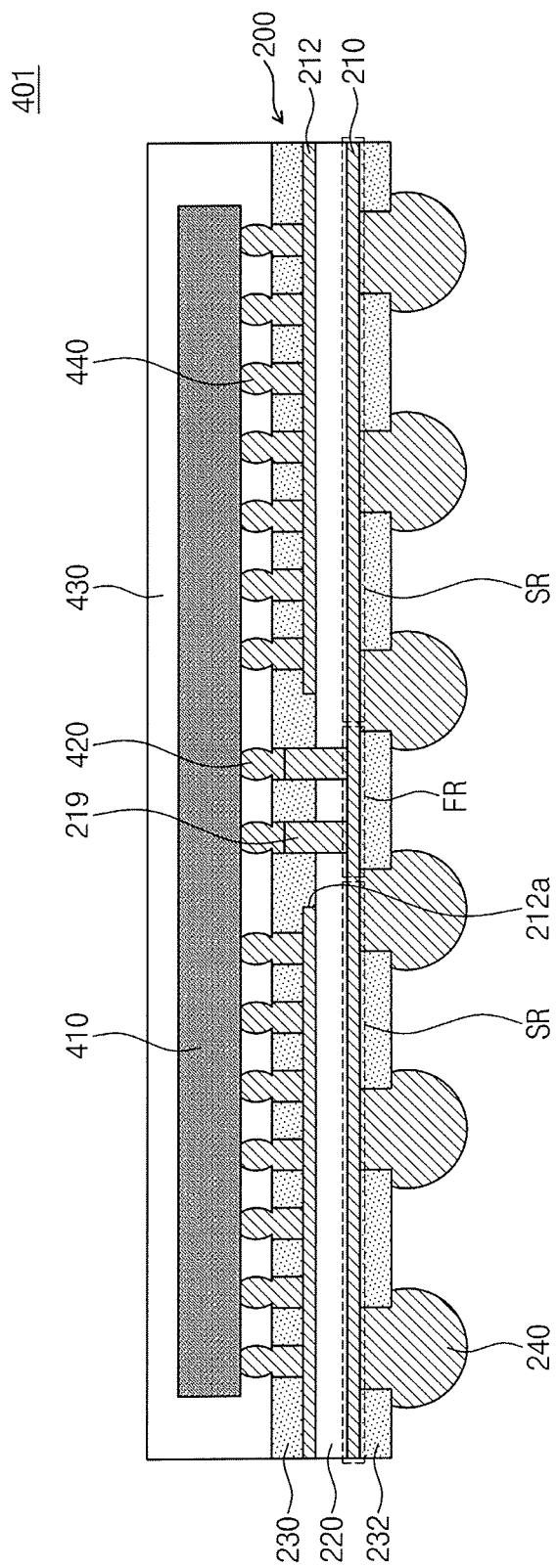
FIG. 11 is a sectional view taken along line I-I' of FIG. 4 illustrating a semiconductor package according to an exemplary embodiment of the present inventive concept.

FIG. 11 is a sectional view taken along line I-I' of FIG. 4 illustrating a semiconductor package according to an exemplary embodiment of the present inventive concept. A semiconductor package according to an exemplary embodiment of the present inventive concept may include the printed circuit board 200 of FIG. 5. Hereinafter, a semiconductor package according to an exemplary embodiment of the present inventive concept will be described in more detail with reference to FIG. 8.

Referring to FIG. 11, a semiconductor package 401 may include the printed circuit board 100, the semiconductor chip 410, the chip bumps 420, the mold layer 430, and heat-dissipation bumps 440. Elements of the semiconductor package 301, other than the second conductive layer 212 and the heat-dissipation bumps 440, may be substantially the same as those of the semiconductor package 400 of FIG. 10. Thus, duplicative descriptions of the other elements of the semiconductor package 300 may be omitted below.

The heat-dissipation bumps 440 may be disposed on the top surface of the second conductive layer 212. The heat-dissipation bumps 440 may be in contact with the second conductive layer 212. The heat-dissipation bumps 440 may be in contact with the semiconductor chip 410 through the upper solder resist layer 230. Accordingly, heat generated in the semiconductor chip 410 may be dissipated to the second conductive layer 212 through the heat-dissipation bumps 440. The heat-dissipation bumps 440 may include a material having a thermal conductivity that higher than that of air. For example, the heat-dissipation bumps 440 may include at least one metallic material (e.g., copper (Cu), aluminum (Al), nickel (Ni), iron (Fe), tungsten (W), silver (Ag), or gold (Au)) or alloys thereof.

The second conductive layer 212 may be connected to the heat-dissipation bumps 440 and may be used as a heat-dissipation layer for dissipating heat generated in the semiconductor chip 410 to the outside. For example, the second conductive layer 212 may have a flat plate shape. According to an exemplary embodiment of the present inventive concept, the second conductive layer 212 may include a pattern that includes a same material as the wiring pattern of the second region SR of the first conductive layer 210 and has the same or similar shape as the wiring pattern of the second region SR of the first conductive layer 210. The second conductive layer 212 may include a material having a thermal conductivity that is higher than that of air. For example, the second conductive layer 212 may include at least one metallic material (e.g., copper (Cu), aluminum (Al), nickel (Ni), iron (Fe), tungsten (W), silver (Ag), or gold (Au)) or alloys thereof.

According to an exemplary embodiment of the present inventive concept, the semiconductor package 401 may be configured to discharge heat generated in the semiconductor chip 410 to the second conductive layer 212. Thus, performance and stability of the semiconductor chip 410 may be increased.

Figure 12:
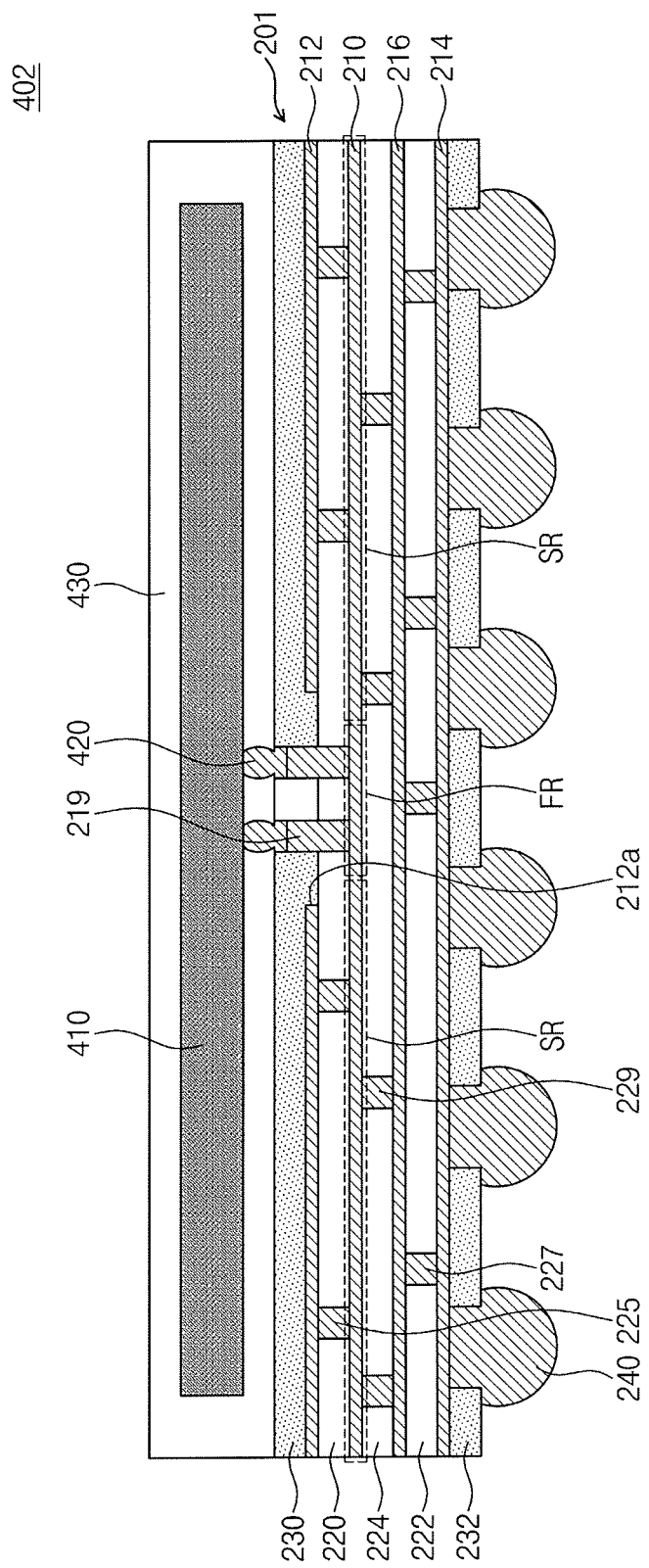
FIG. 12 is a sectional view taken along line I-I' of FIG. 4 illustrating a semiconductor package according to an exemplary embodiment of the present inventive concept.

FIG. 12 is a sectional view taken along line I-I' of FIG. 4 illustrating a semiconductor package according to an exemplary embodiment of the present inventive concept. A semiconductor package according to an exemplary embodiment of the present inventive concept may include the printed circuit board 201 of FIG. 6. Hereinafter, a semiconductor package according to an exemplary embodiment of the present inventive concept will be described in more detail with reference to FIG. 12.

Referring to FIG. 12, a semiconductor package 402 may include the printed circuit board 201, the semiconductor chip 410, chip bumps 420, and the mold layer 430. The printed circuit board 201 may be substantially the same as the printed circuit board 201 of FIG. 6. Thus, duplicative descriptions of the printed circuit board 201 may be omitted below.

The semiconductor chip 410 may be mounted on the printed circuit board 201. The chip bumps 420 may be disposed on the protruding pads 219 and may electrically connect the semiconductor chip 410 and the first conductive layer 210. For example, the semiconductor chip 410 may be connected to the first conductive layer 210, in a flip-chip manner, through the chip bumps 420 on the protruding pads 219. Accordingly, the first conductive layer 210 may be connected to signal pads of the semiconductor chip 410, thereby serving as a signal layer for delivering electrical signals. The second conductive layer 212 may be connected to power (or ground) pads of the semiconductor chip 410 through the first conductive layer 210 and the first through wires 225, and thus, it may be used as a power (or ground) layer. The fourth conductive layer 216 may be connected to the ground (or power) pads of the semiconductor chip 410 through the first conductive layer 210 and the third through wires 229, and thus, it may be used as a ground (or power) layer. The first, second, and fourth conductive layers 210, 212, and 216 may constitute a strip line structure, in which the signal layer is disposed between the ground and power layers, and thus, it may be possible to reduce or eliminate distortion of electrical signals transmitted through the first conductive layer 210.

The mold layer 430 may encapsulate the semiconductor chip 410. In other words, the mold layer 430 may cover the semiconductor chip 410 and the top surface of the printed circuit board 201 and may fill gap regions between the semiconductor chip 410 and the printed circuit board 201 and between the chip bumps 420. The mold layer 430 may include an epoxy molding compound.

FIGS. 13A through 13H are sectional views illustrating methods of forming the printed circuit board and the semiconductor packages according to exemplary embodiments of the present inventive concept. Hereinafter, methods of forming the printed circuit board and the semiconductor packages including the printed circuit board according to exemplary embodiments of the present inventive concept will be described in more detail with reference to FIGS. 13A through 13H. Previously described elements may be identified by a similar or identical reference number and duplicative descriptions may be omitted below.

Referring to FIG. 13A, the first conductive layer 110 and the second conductive layer 112 may be formed on the bottom and top surfaces, respectively, of the core layer 120. The first conductive layer 110 and the second conductive layer 112 may be deposited using a chemical vapor deposition (CVD) method, a physical vapor deposition (PVD) method, an atomic layer deposition (ALD) method, or an electroplating method.

Referring to FIG. 13B, the second conductive layer 112 and the core layer 120 may be sequentially etched to form openings 112a and 120a. The openings 112a and 120a may expose the first conductive layer 110. The first opening 120a may overlap the second opening 112a, when viewed in a plan view, and may have a size equal to or smaller than that of the second opening 112a. As will be described in more detail below, this difference in size between the first and second openings 112a and 120a may make it possible to prevent the first conductive layer 110 from being in contact with the second conductive layer 112, when the protruding portion 110b of the first conductive layer 110 is formed. As desired, the second conductive layer 112 may be patterned to form desired conductive patterns, when the second opening 112a is formed using an etching process. Before the formation of the first opening 120a, another etching process may be performed to pattern the first conductive layer 110.

Figure 13C:
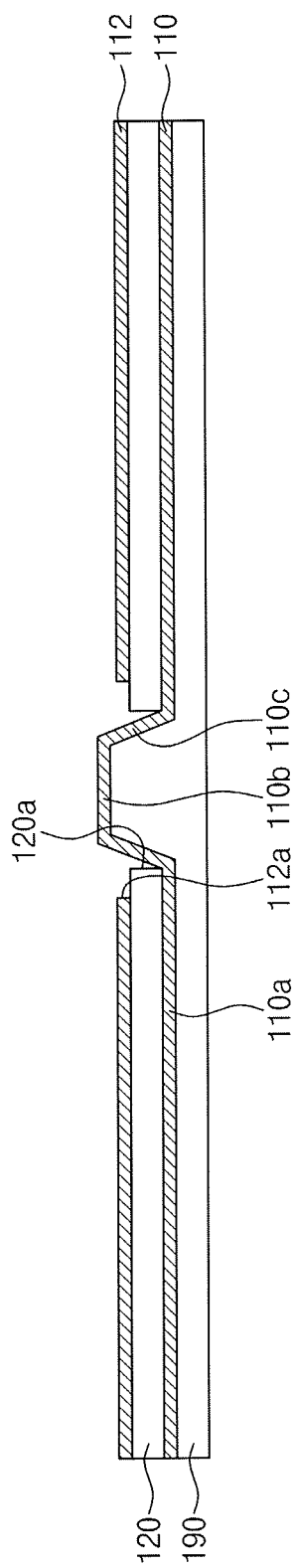
Figure 13D:
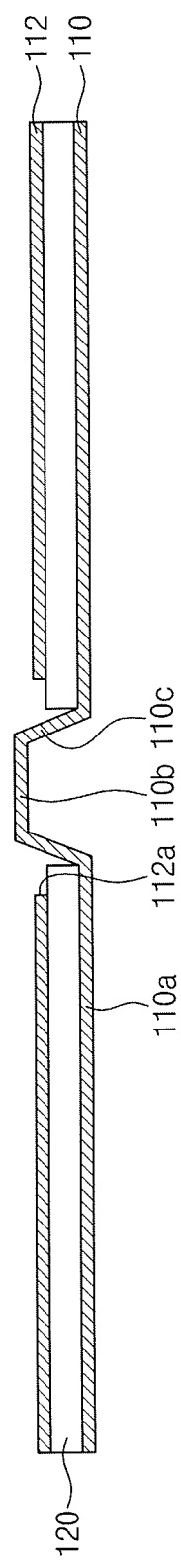

Referring to FIGS. 13C and 13D, the first conductive layer 110 may be etched to form the recessed portion 110a, the protruding portion 110b, and the connecting portion 110c. The formation of the protruding and connecting portions 110b and 110c may include exerting pressure on the bottom surface of the first conductive layer 110 toward the core layer 120. The exertion of pressure may be performed using a structure 190 having a shape corresponding to the shapes of the protruding and connecting portions 110b and 110c. During the pressing step, the core layer 120 may serve as a supporter, and this may make it possible to selectively bend a portion of the first conductive layer 110 exposed by the first opening 120a. A portion of the first conductive layer 110 supported by the core layer 120 may be used as the recessed portion 110a, and another portion of the first conductive layer 110, on which the pressure is exerted, may be used as the protruding portion 110b and the connecting portion 110c. When forming the recessed portion 110a, the protruding portion 110b, and the connecting portion 110c may be finished, and the structure 190 may be removed.

Referring to FIG. 13E, the upper solder resist layer 130 may be formed on the second conductive layer 112, and the lower solder resist layer 132 may be formed below the first conductive layer 110.

The formation of the upper solder resist layer 130 may include coating a solder resist material to cover the second conductive layer 112 and the first conductive layer 110 exposed by the second opening 112a, and then etching the solder resist material to expose at least a portion of the protruding portion 110b of the first conductive layer 110. According to an exemplary embodiment of the present inventive concept, when the second conductive layer 112 is used as a heat-dissipation layer, the etching process of the solder resist material may expose a portion of the second conductive layer 112.

The formation of the lower solder resist layer 132 may include coating a solder resist material to cover the bottom surface of the first conductive layer 110, and then etching the solder resist material to expose at least a portion of the recessed portion 110a of the first conductive layer 110.

Referring to FIG. 13F, the outer connection solder balls 140 may be formed on the bottom surface of the recessed portion 110a of the first conductive layer 110 that is exposed by the lower solder resist layer 132. Thus, the formation of the printed circuit board 100 according to an exemplary embodiment of the present inventive concept may be finished.

Figure 13G:
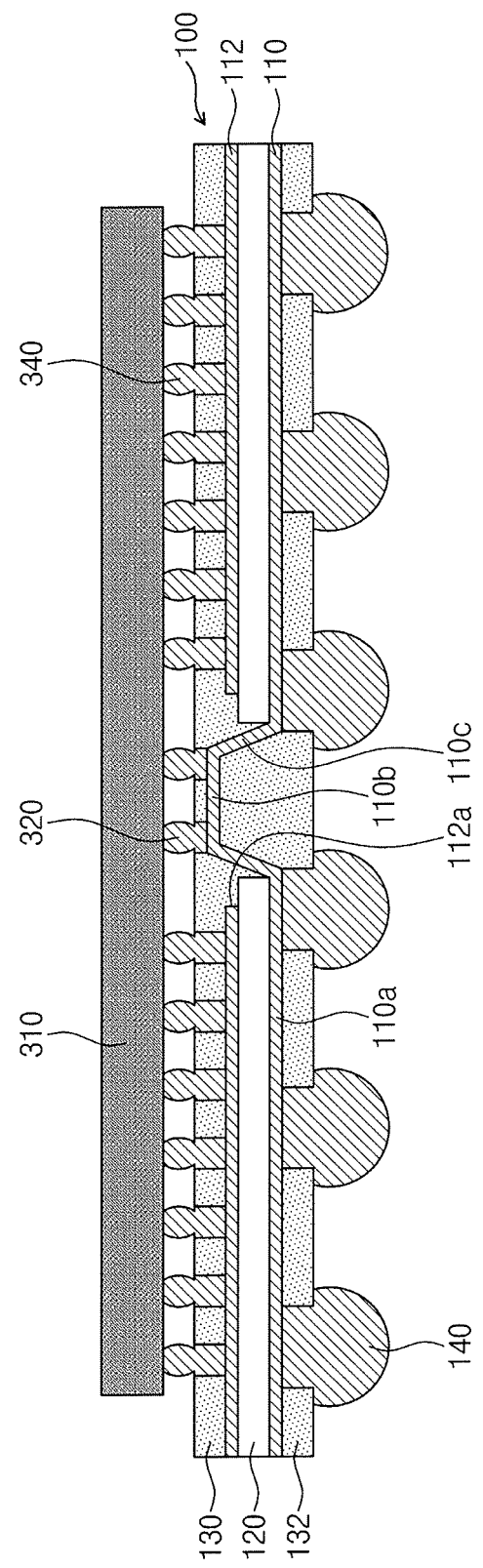

Referring to FIG. 13G, the semiconductor chip 310 may be mounted on the printed circuit board 100. The mounting of the semiconductor chip 310 may include forming the chip bumps 320 on the protruding portion 110b of the first conductive layer 110 exposed by the upper solder resist layer 130, and then connecting the semiconductor chip 310 to the chip bumps 320. According to an exemplary embodiment of the present inventive concept, when the second conductive layer 112 is used as a heat-dissipation layer, the heat-dissipation bumps 340 may be formed on the second conductive layer 112 exposed by the upper solder resist layer 130. The semiconductor chip 310 may be mounted to be in contact with the heat-dissipation bumps 340.

Figure 13H:
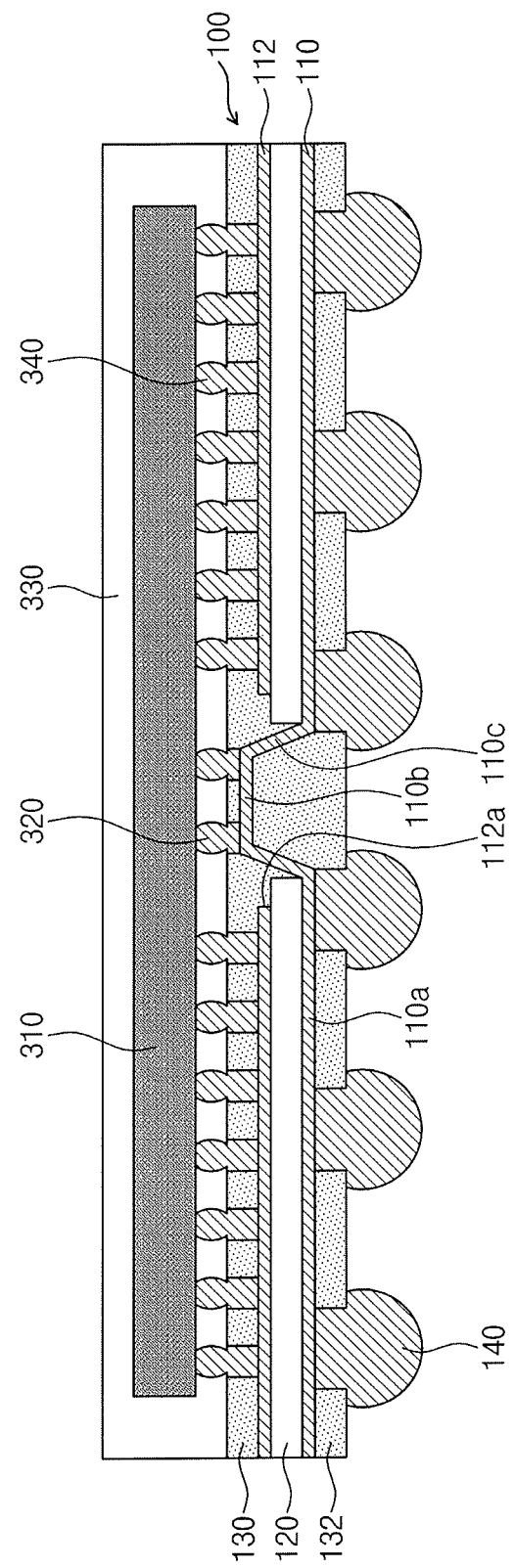

Referring to FIG. 13H, the mold layer 330 may be formed to encapsulate the semiconductor chip 310. Then, the formation of the semiconductor package according to an exemplary embodiment of the present inventive concept may be completed. The method of forming the semiconductor package according to an exemplary embodiment of the present inventive concept may be performed in a similar manner as the method according to the above described exemplary embodiments of the present inventive concept, except that the upper solder resist layer 130 may be etched to expose a portion of the second conductive layer 112 and the heat-dissipation bumps 340 may be formed thereon.

FIGS. 14A through 14I are sectional views illustrating methods of forming the printed circuit board and the semiconductor packages according to exemplary embodiments of the present inventive concept. Hereinafter, methods of forming the printed circuit board and the semiconductor packages including the printed circuit boards according to exemplary embodiments of the present inventive concept will be described in more detail with reference to FIGS. 14A through 14I. Previously described elements may be identified by similar or identical reference numbers and duplicative descriptions may be omitted below.

Figure 14A:
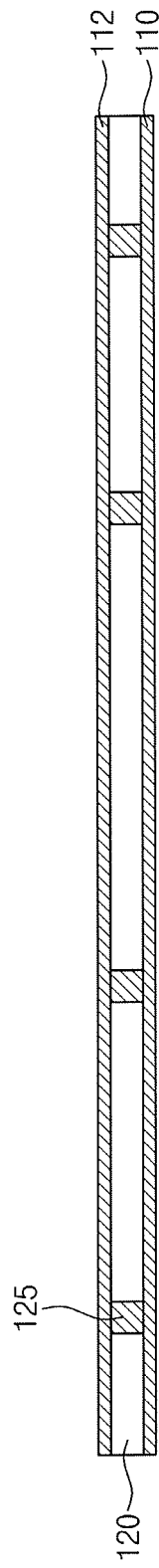

Referring to FIG. 14A, the first and second conductive layers 110 and 112 may be respectively formed on the bottom and top surfaces of the core layer 120, and the first through wires 125 may be formed through the core layer 120 to connect the first and second conductive layers 110 and 112 to each other. The first conductive layer 110 may be deposited on a bottom surface of the core layer 120, by a chemical vapor deposition (CVD) method, a physical vapor deposition (PVD) method, an atomic layer deposition (ALD) method, or an electroplating method. The second conductive layer 112 and the first through wires 125 may be formed by forming through vias to penetrate the core layer 120, depositing a conductive material on the top surface of the core layer 120 to fill the through vias, and then planarizing the resulting structure. The deposition of the conductive material may be performed by a chemical vapor deposition (CVD) method, a physical vapor deposition (PVD) method, an atomic layer deposition (ALD) method, or an electroplating method.

Figure 14B:
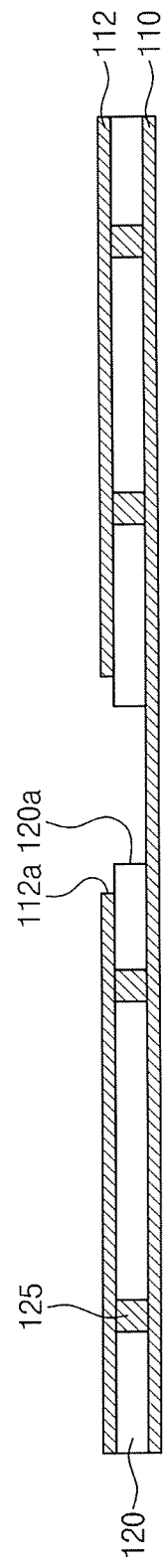
Figure 14C:
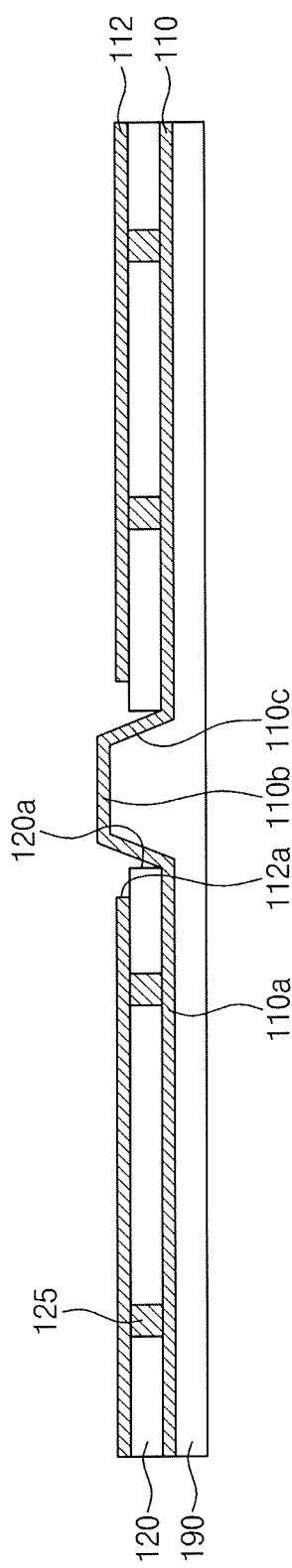
Figure 14D:
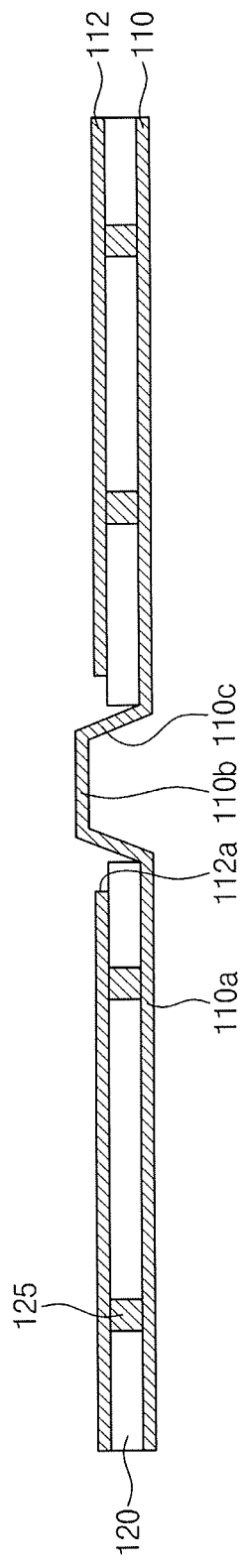

Referring to FIGS. 14B through 14D, the second opening 112a, the first opening 120a, the recessed portion 110a, the protruding portion 110b, and the connecting portion 110c may be formed using the same or similar method as that described above with reference to FIGS. 13B through 13D.

According to exemplary embodiments of the present inventive concept, at least one of the first and second conductive layers 110 and 112 may include patterned structures, such as wiring patterns.

Referring to FIG. 14E, the third conductive layer 114, the fourth conductive layer 116, the first insulating layer 122, the second insulating layer 124, the second through wires 127, and the third through wires 129 may be formed.

The second insulating layer 124 may be formed by depositing an insulating material on the bottom surface of the first conductive layer 110. Through vias for the third through wires 129 may be formed in the second insulating layer 124. The third through wires 129 and the fourth conductive layer 116 may be formed by depositing a conductive material on the bottom surface of the first conductive layer 110, filling the through vias and then planarizing the resulting structure. The fourth conductive layer 116 may be etched to form patterned structures, such as wiring patterns.

The first insulating layer 122, the second through wires 127, and the third conductive layer 114 may be formed using substantially the same methods as those for forming the second insulating layer 124, the third through wires 129, and the fourth conductive layer 116.

Referring to FIG. 14F, the upper solder resist layer 130 may be formed on the second conductive layer 112, and the lower solder resist layer 132 may be formed below the third conductive layer 130.

The formation of the upper solder resist layer 130 may include coating a solder resist material to cover the second conductive layer 112 and the first conductive layer 110 exposed by the second opening 112a, and then etching the solder resist material to expose at least a portion of the protruding portion 110b of the first conductive layer 110.

The formation of the lower solder resist layer 132 may include coating a solder resist material to cover the bottom surface of the third conductive layer 114, and then etching the solder resist material to expose at least a portion of the third conductive layer 114.

Figure 14G:
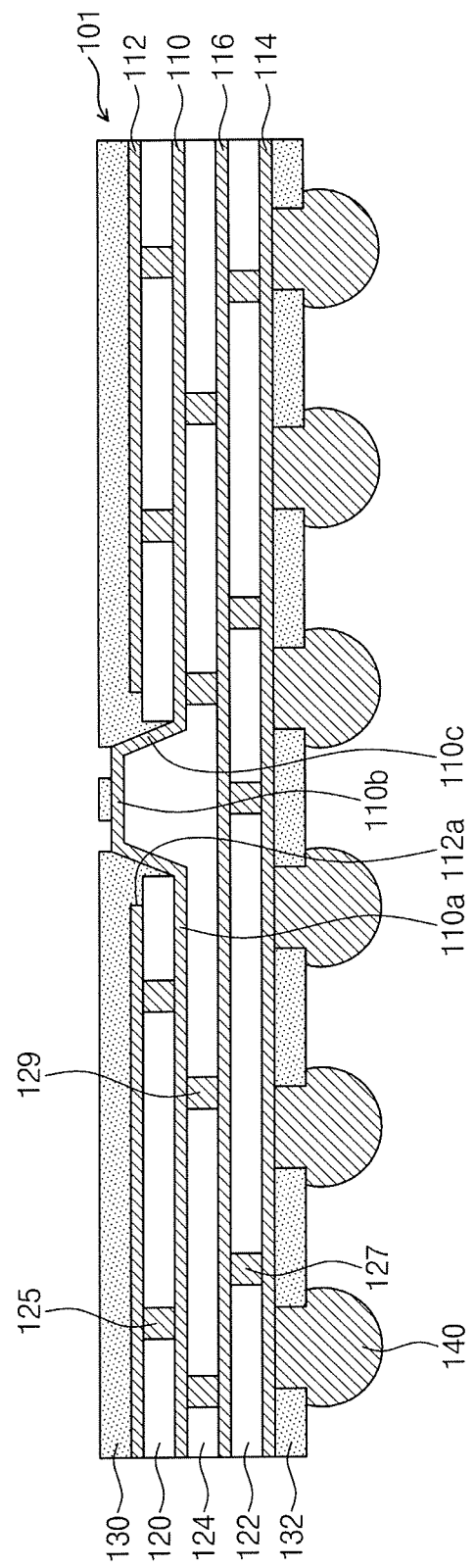

Referring to FIG. 14G, the outer connection solder balls 140 may be formed on the bottom surface of the third conductive layer 114 that is exposed by the lower solder resist layer 132. Then, the formation of the printed circuit board 101 according to an exemplary embodiment of the present inventive concept may be completed.

Figure 14H:
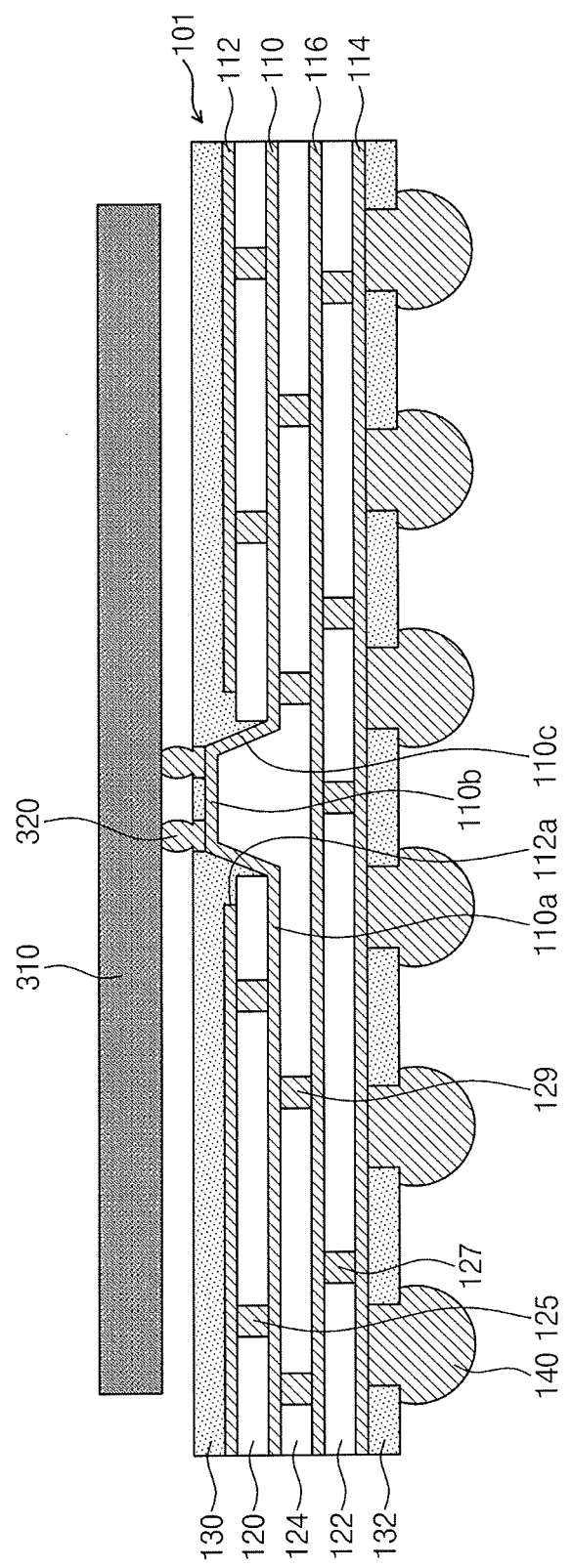

Referring to FIG. 14H, the semiconductor chip 310 may be mounted on the printed circuit board 101. The mounting of the semiconductor chip 310 may include forming the chip bumps 320 on the protruding portion 110b of the first conductive layer 110 exposed by the upper solder resist layer 130, and then connecting the semiconductor chip 310 to the chip bumps 320.

Figure 14I:
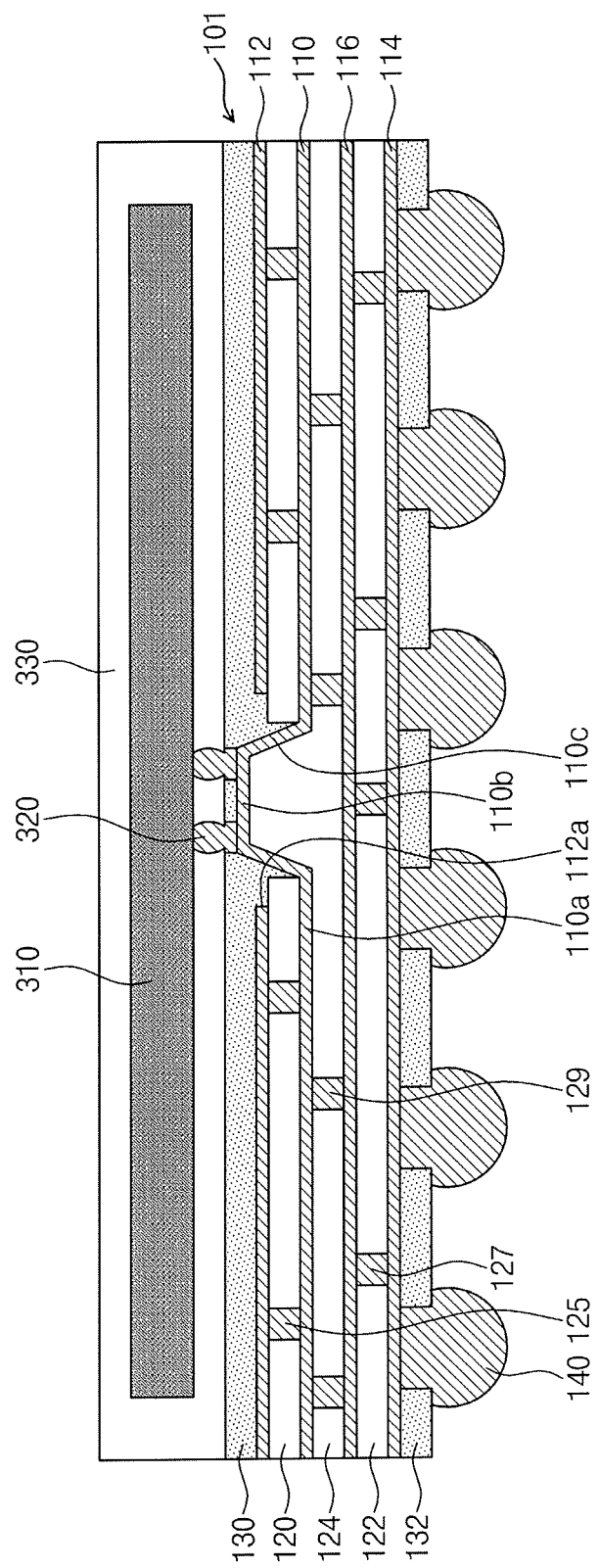

Referring to FIG. 14I, the mold layer 330 may be formed to encapsulate the semiconductor chip 310. Then, the formation of the semiconductor package according to an exemplary embodiment of the present inventive concept may be completed.

FIGS. 15A through 15G are sectional views illustrating methods of forming the printed circuit board and the semiconductor packages including the same according to exemplary embodiments of the present inventive concept. Hereinafter, methods of forming the printed circuit board and the semiconductor packages including the same according to exemplary embodiments of the present inventive concept will be described in more detail with reference to FIGS. 15A through 15G. Previously described elements may be identified by similar or identical reference numbers below.

Referring to FIG. 15A, the first conductive layer 210 and the second conductive layer 212 may be formed on the bottom and top surfaces, respectively, of the core layer 220. The first conductive layer 210 and the second conductive layer 212 may be deposited using a chemical vapor deposition (CVD) method, a physical vapor deposition (PVD) method, an atomic layer deposition (ALD) method, or an electroplating method. The first conductive layer 210 may include the first region FR disposed at a central region of the first conductive layer and the second region SR surrounding the first region FR. The second conductive layer 212 may be etched to form the opening 212a, which may overlap the first region FR when viewed in a plan view. As desired, the second conductive layer 212 may be patterned to form pattern structures, such as wiring patterns during the etching process for forming the opening 212a. Similarly, the first conductive layer 210 may be etched to form patterned structures, such as wiring patterns.

Referring to FIGS. 15B and 15C, the upper solder resist layer 230 may be formed on the second conductive layer 212, and the lower solder resist layer 232 may be formed below the first conductive layer 210.

The upper solder resist layer 230 may be formed by coating a solder resist material to cover the second conductive layer 212 and the core layer 220 exposed by the opening 212a of the second conductive layer 212. The upper solder resist layer 230 may be partially etched to form openings 230a on the first region FR. According to exemplary embodiments of the present inventive concept, when the second conductive layer 212 is used as a heat-dissipation layer, the etching process may be performed to expose a portion of the second conductive layer 212. The core layer 220 exposed by the openings 230a of the upper solder resist layer 230 may be etched to form openings 220a in the core layer 220. The first region FR of the first conductive layer 210 may be partially exposed through the openings 230a of the solder resist layer 230 and the openings 220a of the core layer 220.

The formation of the lower solder resist layer 232 may include coating a solder resist material to cover the bottom surface of the first conductive layer 210, and then etching the solder resist material to expose at least a portion of the first conductive layer 210.

Referring to FIG. 15D, the protruding pads 219 may be formed on the first region FR. The formation of the protruding pads 219 may include forming a conductive material on the upper solder resist layer 230 to fill the openings 230a and 220a of the solder resist layer 230 and the core layer 220, and then etching a portion of the conductive material.

Referring to FIG. 15E, the outer connection solder balls 240 may be formed on the bottom surface of the first conductive layer 210 exposed by the lower solder resist layer 232. Then, the formation of the printed circuit board 200 according to an exemplary embodiment of the present inventive concept may be completed.

Referring to FIG. 15F, the semiconductor chip 410 may be mounted on the printed circuit board 200. The mounting of the semiconductor chip 410 may include forming the chip bumps 420 on the protruding pads 219, and connecting the semiconductor chip 410 to the chip bumps 420. According to exemplary embodiments of the present inventive concept, when the second conductive layer 212 is used as a heat-dissipation layer, the heat-dissipation bumps 440 may be formed on the second conductive layer 212 exposed by the upper solder resist layer 230. The semiconductor chip 410 may be in contact with the heat-dissipation bumps 440.

Figure 15G:
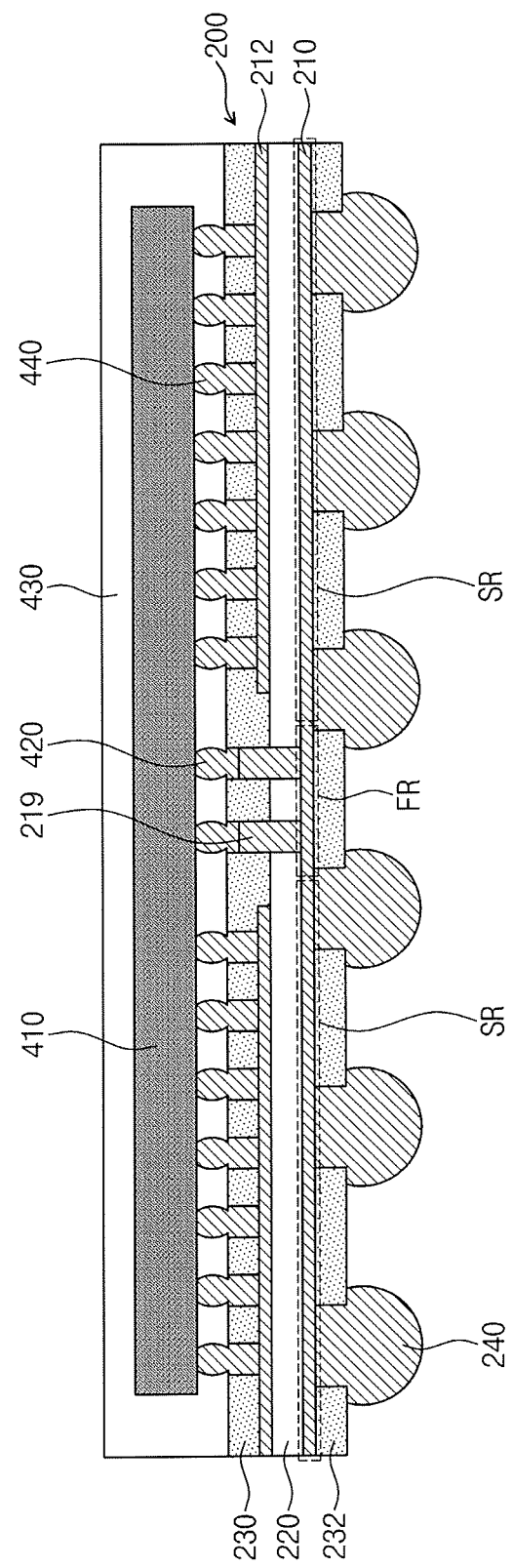

Referring to FIG. 15G, the mold layer 430 may be formed to encapsulate the semiconductor chip 410. Then, the formation of the semiconductor package according to an exemplary embodiment of the present inventive concept may be completed. The method of fabricating the semiconductor package according to an exemplary embodiment of the present inventive concept may be performed in a similar manner as the method according to the above described exemplary embodiments of the present inventive concept, except that the upper solder resist layer 230 may be etched to expose a portion of the second conductive layer 212, and the heat-dissipation bumps 440 may be formed thereon.

FIGS. 16A through 16H are sectional views illustrating methods of forming the printed circuit board and the semiconductor packages including the same according to exemplary embodiments of the present inventive concept. Hereinafter, methods of forming the printed circuit board and the semiconductor packages including the same according to exemplary embodiments of the present inventive concept will be described in more detail with reference to FIGS. 16A through 16H. Previously described elements may be identified by similar or identical reference numbers and duplicative descriptions may be omitted below.

Referring to FIG. 16A, the first conductive layer 210 and the second conductive layer 212 may be formed on the bottom and top surfaces, respectively, of the core layer 220, and the first through wires 225 may be formed through the core layer 220 to connect the first and second conductive layers 210 and 212 to each other. The first conductive layer 210 may be deposited on a bottom surface of the core layer 220, by a chemical vapor deposition (CVD) method, a physical vapor deposition (PVD) method, an atomic layer deposition (ALD) method, or an electroplating method. The first conductive layer 210 may include the first region FR disposed at a central region thereof and the second region SR surrounding the first region FR. The formation of the second conductive layer 212 and the first through wires 225 may include forming through vias to penetrate the core layer 220, depositing a conductive material on the top surface of the core layer 220 to fill the through vias, and then planarizing the conductive material. The second conductive layer 212 may be etched to form the opening 212a, which may overlap the first region FR when viewed in a plan view. As desired, the second conductive layer 212 may be patterned to form desired patterns, such as wiring patterns, during the etching process for forming the opening 212a. Similarly, the first conductive layer 210 may be etched to form patterned structures, such as wiring patterns.

Referring to FIG. 16B, the third conductive layer 214, the fourth conductive layer 216, the first insulating layer 222, the second insulating layer 224, the second through wires 227, and the third through wires 229 may be formed. The third conductive layer 214, the fourth conductive layer 216, the first insulating layer 222, the second insulating layer 224, the second through wires 227, and the third through wires 229 may be formed using substantially the same or similar methods as those for forming the third conductive layer (e.g., the third conductive layer 114 of FIG. 14E), the fourth conductive layer (e.g., the fourth conductive layer 116 of FIG. 14E), the first insulating layer (e.g., the first insulating layer 122 of FIG. 14E), the second insulating layer (e.g., the second insulating layer 124 of FIG. 14E), the second through wires (e.g., the second through wires 127 of FIG. 14E), and the third through wires (e.g., the third through wires 129 of FIG. 14E) according to exemplary embodiments of the present inventive concept.

Figure 16C:
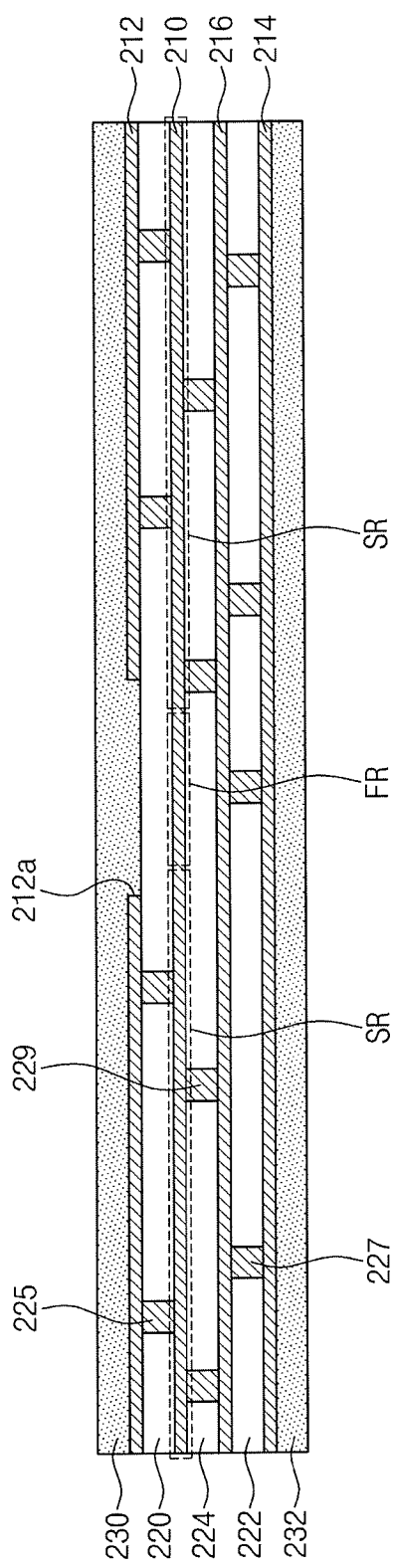
Figure 16D:
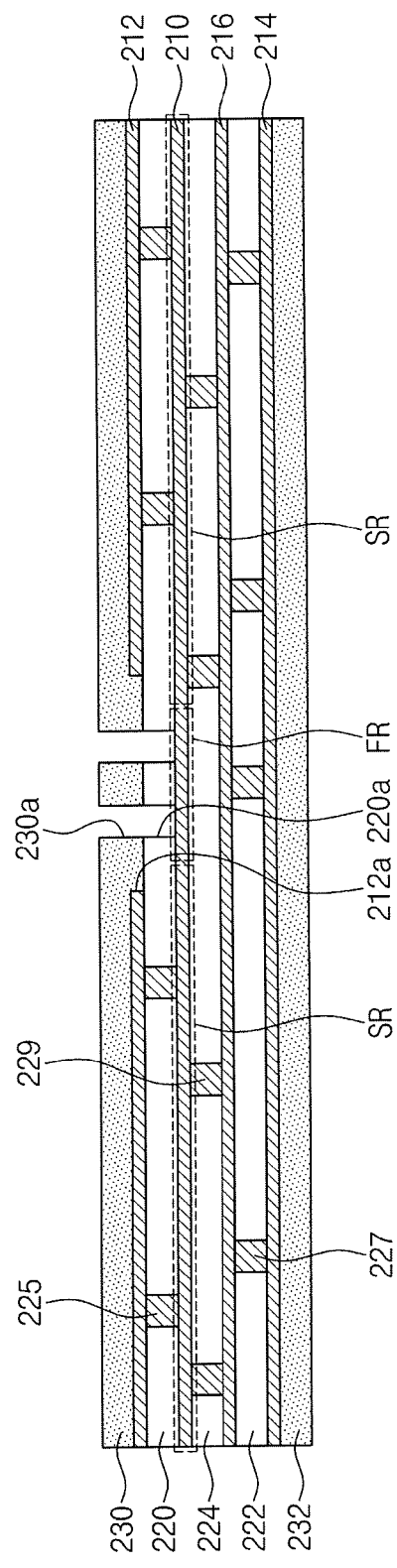

Referring to FIGS. 16C and 16D, the upper solder resist layer 230 may be formed on the second conductive layer 212, and the lower solder resist layer 232 may be formed below the third conductive layer 214.

The upper solder resist layer 230 may be formed by coating a solder resist material to cover the second conductive layer 212 and the core layer 220 exposed by the opening 212a of the second conductive layer 212. Thereafter, the upper solder resist layer 230 may be partially etched to form openings 230a on the first region FR. The core layer 220 exposed by the openings 230a of the upper solder resist layer 230 may be etched to form openings 220a in the core layer 220. The first region FR of the first conductive layer 210 may be partially exposed through the openings 230a of the solder resist layer 230 and the openings 220a of the core layer 220.

The formation of the lower solder resist layer 232 may include coating a solder resist material to cover the bottom surface of the third conductive layer 214, and then etching the solder resist material to expose at least a portion of the third conductive layer 214.

Figure 16E:
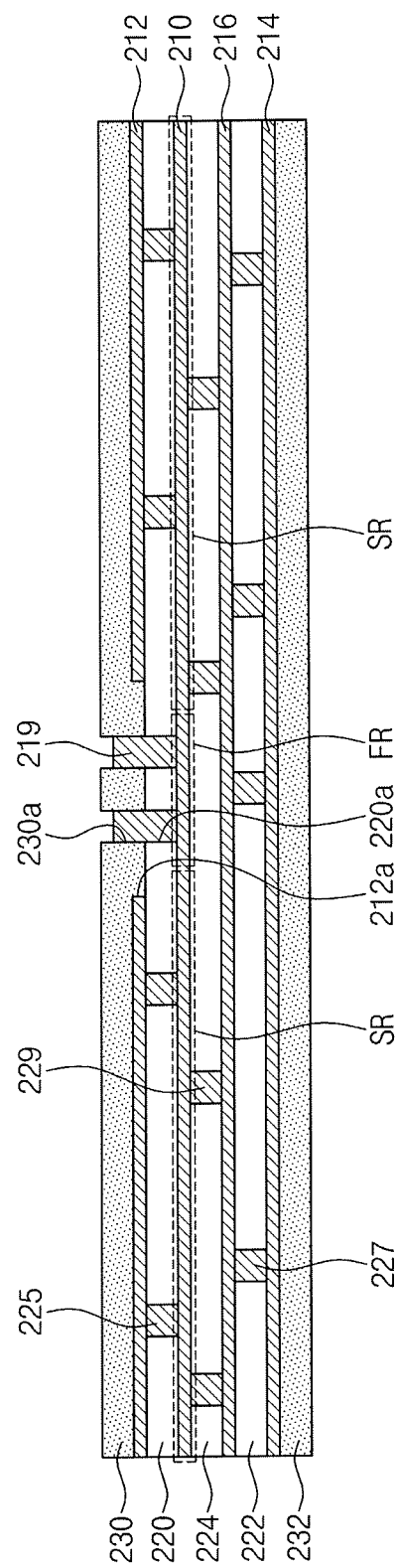

Referring to FIG. 16E, the protruding pads 219 may be formed on the first region FR. The formation of the protruding pads 219 may include forming a conductive material on the upper solder resist layer 230 to fill the openings 230a of the solder resist layer 230 and the openings 220a of the core layer 220, and then etching a portion of the conductive material.

Figure 16F:
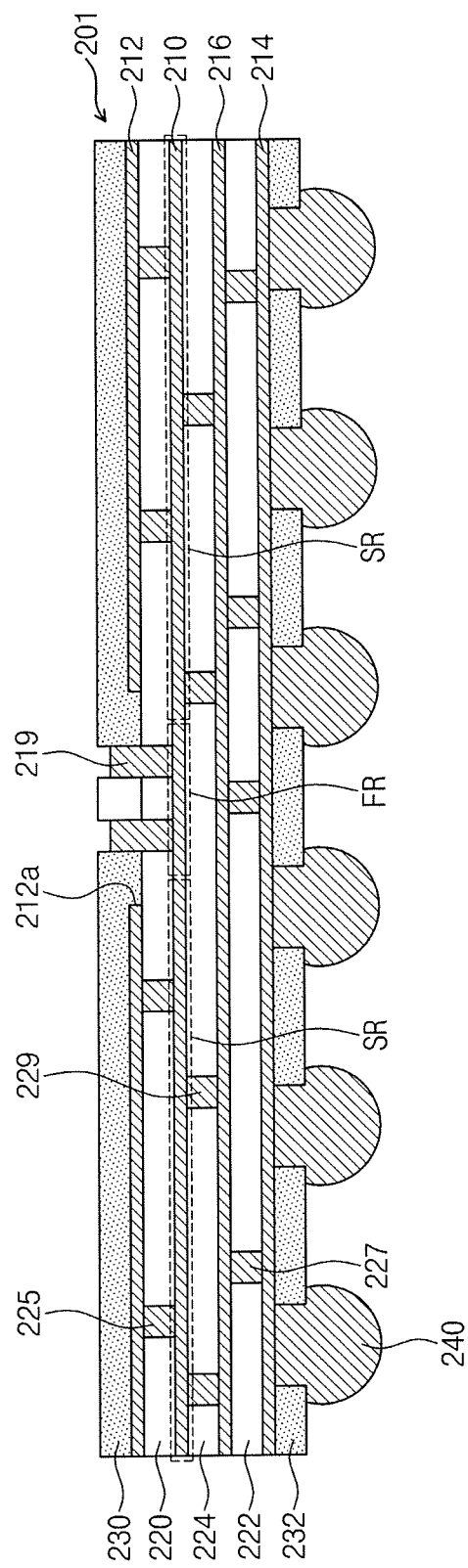

Referring to FIG. 16F, the outer connection solder balls 240 may be formed on the bottom surface of the third conductive layer 214 exposed by the lower solder resist layer 232. Then, the formation of the printed circuit board 201 according to exemplary embodiments of the present inventive concept may be completed.

Figure 16G:
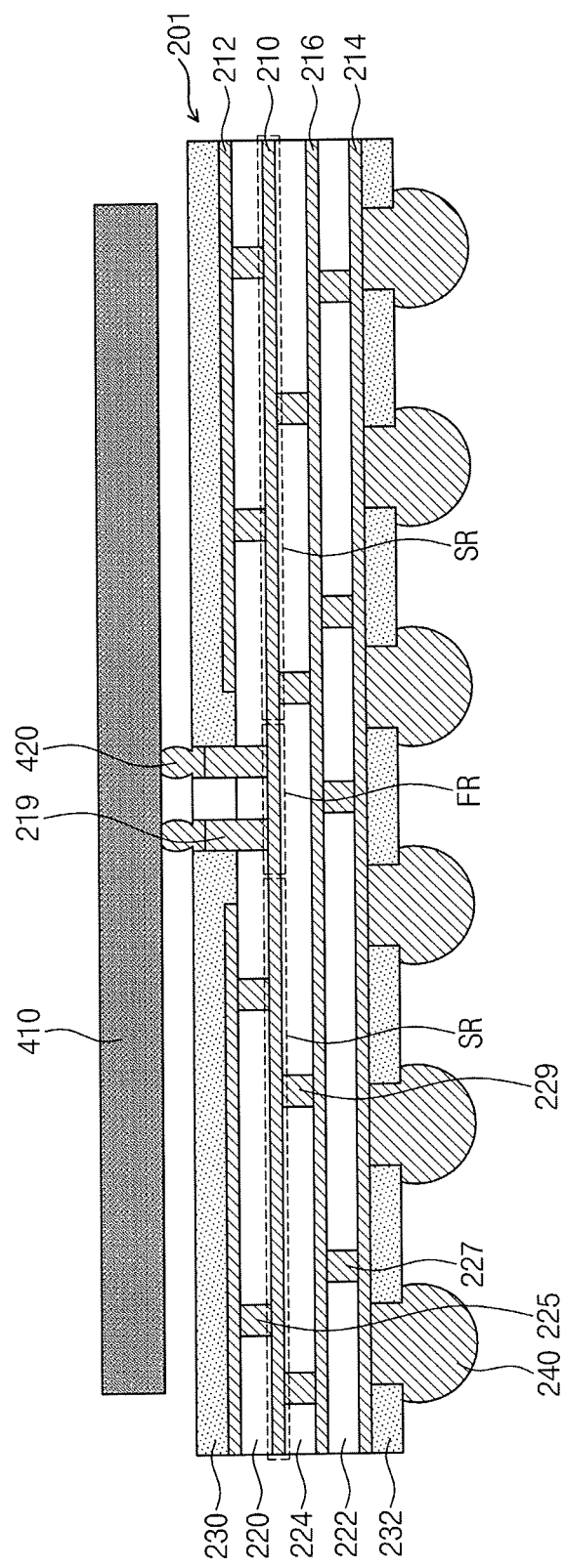

Referring to FIG. 16G, the semiconductor chip 410 may be mounted on the printed circuit board 201. The mounting of the semiconductor chip 410 may include forming the chip bumps 420 on the protruding pads 219, and connecting the semiconductor chip 410 to the chip bumps 420.

Figure 16H:
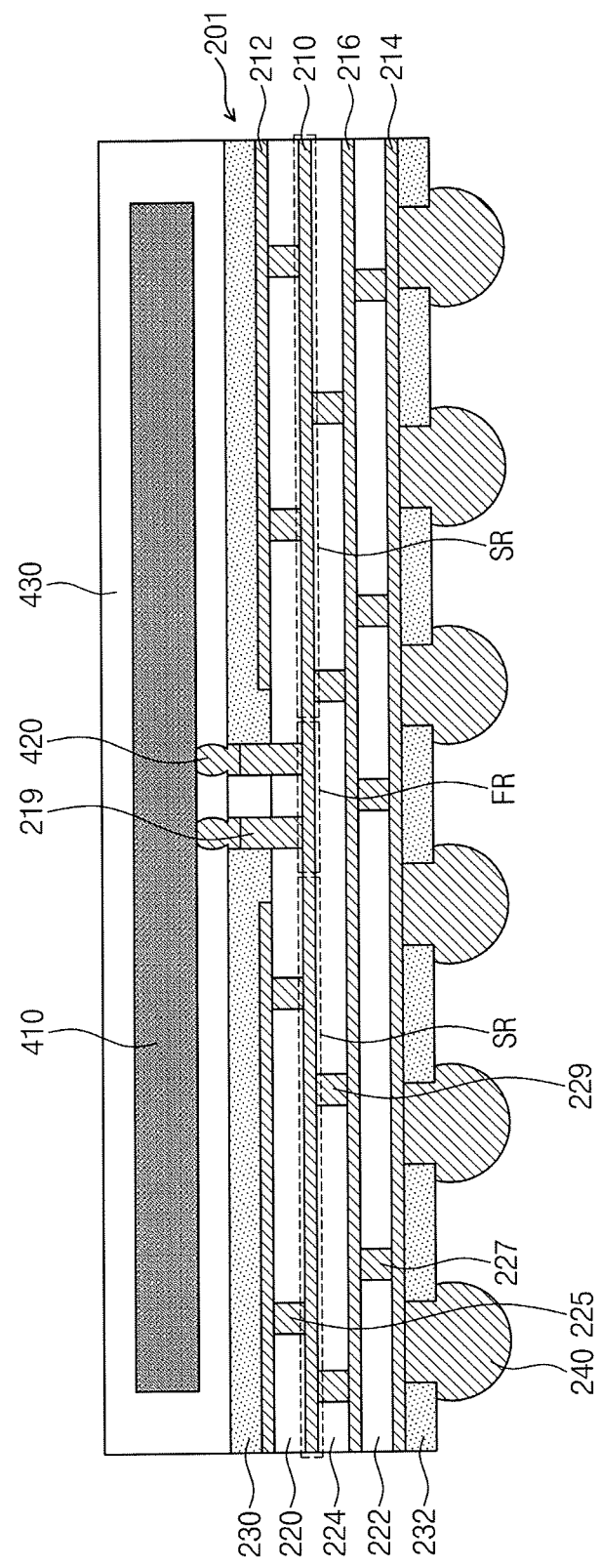

Referring to FIG. 16H, the mold layer 430 may be formed to encapsulate the semiconductor chip 410. Then, the formation of the semiconductor package according to an exemplary embodiment of the present inventive concept may be completed.

Figure 17:
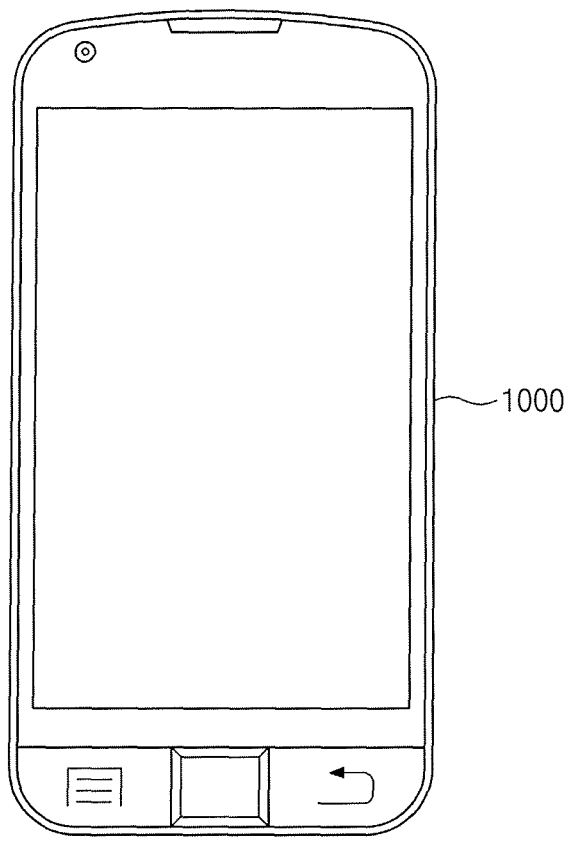
FIG. 17 is a schematic diagram illustrating an exemplary electronic device including a printed circuit board and a semiconductor package according to at least one exemplary embodiment of the present inventive concept.

FIG. 17 is a schematic diagram illustrating an exemplary electronic device including a printed circuit board and a semiconductor package according to at least one exemplary embodiment of the present inventive concept.

Referring to FIG. 17, the printed circuit board and the semiconductor package according to exemplary embodiments of the present inventive concept may be included in a mobile phone 1000. The printed circuit board and the semiconductor package according to exemplary embodiments of the present inventive concept may be included in a smart phone, a personal digital assistant (PDA), a portable multimedia player (PMP), a digital multimedia broadcast (DMB) device, a global positioning system (GPS), a handheld gaming console, a portable computer, a web tablet, a wireless phone, a digital music player, a memory card, or other electronic products, which may be configured to receive or transmit information data wirelessly.

Figure 18:
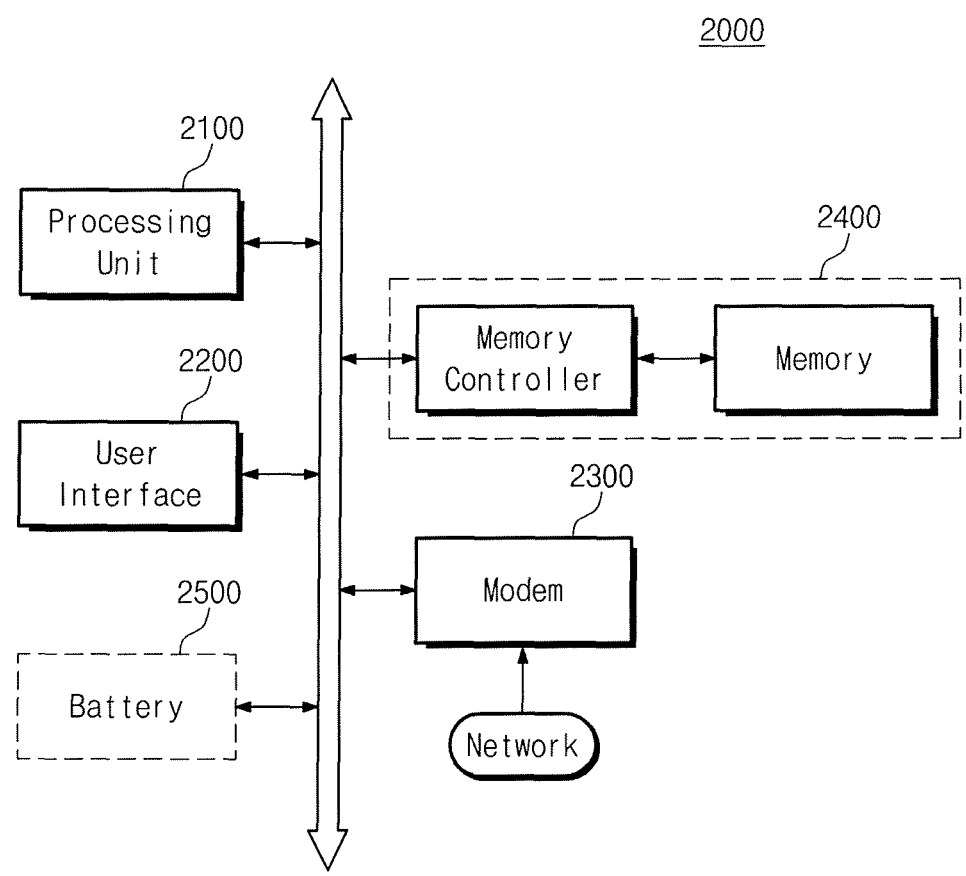
FIG. 18 is a schematic block diagram illustrating an exemplary electronic system including a printed circuit board and a semiconductor package according to at least one exemplary embodiment of the present inventive concept.

FIG. 18 is a schematic block diagram illustrating an exemplary electronic system including a printed circuit board and a semiconductor package according to at least one exemplary embodiment of the present inventive concept.

Referring to FIG. 18, an electronic device 2000 according to exemplary embodiments of the present inventive concept may include a micro-processor 2100, a user interface 2200, a modem 2300 (e.g., a baseband chipset), and a semiconductor package 2400, which may include the printed circuit boards and the semiconductor packages according to exemplary embodiments of the present inventive concept.

When the electronic device 2000 is in a mobile application, the electronic device 2000 may include a battery 2500. The electronic device 2000 may include other electronic components, such as an application chipset and a camera image processor (CIS), as will be obvious to those of ordinary skill in the art.

According to exemplary embodiments of the present inventive concept, a first conductive layer of a printed circuit board may include a protruding portion connected to a semiconductor chip and a recessed portion connected to outer connection solder balls, and thus a via-free printed circuit board may be realized.

According to exemplary embodiments of the present inventive concept, a semiconductor package may be configured in such a way that second and fourth conductive layers serving as power and ground layers may be provided on and below the first conductive layer serving as a signal layer. The first, second, and fourth conductive layers may constitute a strip line, allowing a semiconductor package to have increased electric characteristics.

According to exemplary embodiments of the present inventive concept, a semiconductor package may include heat-dissipation bumps and a heat-dissipation layer configured to dissipate heat from a semiconductor chip, and this may increase thermal stability of the semiconductor package.

While the present inventive concept has been particularly shown and described with reference to exemplary embodiments thereof, it will be understood by those of ordinary skill in the art that various changes in form and detail may be made therein without departing from the spirit and scope of the present inventive concept.

What is claimed is:

1. A printed circuit board, comprising:
    a first conductive layer including a recessed portion, a protruding portion disposed at a higher level than that of the recessed portion, and a connecting portion connecting the recessed portion with the protruding portion;
    a second conductive layer disposed above the recessed portion of the first conductive layer;
    a core layer disposed between the first conductive layer and the second conductive layer;
    an upper solder resist layer disposed on the second conductive layer, wherein the upper solder resist layer exposes at least a portion of the protruding portion; and
    a lower solder resist layer disposed below the first conductive layer.

2. The printed circuit board of claim 1, wherein a level of a top surface of the protruding portion is substantially equal to or higher than a level of a top surface of the second conductive layer.

3. The printed circuit board of claim 1, wherein a level of a top surface of the protruding portion is substantially equal to or lower than a level of a top surface of the upper solder resist layer.

4. The printed circuit board of claim 1, wherein a top surface of the recessed portion is parallel to a top surface of the protruding portion.

5. The printed circuit board of claim 1, wherein the second conductive layer comprises a pattern having a same shape as a shape of the recessed portion of the first conductive layer.

6. The printed circuit board of claim 1, further comprising outer connection solder balls penetrating the lower solder resist layer, wherein the outer connection solder balls are electrically connected to the first conductive layer.

7. A semiconductor package, comprising:
    a printed circuit board;
    a semiconductor chip disposed on the printed circuit board; and
    a mold layer encapsulating the semiconductor chip,
    wherein the printed circuit board comprises:
    a first conductive layer including a recessed portion, a protruding portion disposed at a higher level than that of the recessed portion, and a connecting portion connecting the recessed portion with the protruding portion;
    a second conductive layer disposed above the recessed portion of the first conductive layer;
    a core layer disposed between the first conductive layer and the second conductive layer;
    an upper solder resist layer disposed on the second conductive layer, wherein the upper solder resist layer exposes at least a portion of the protruding portion; and
    a lower solder resist layer disposed below the first conductive layer,
    wherein the semiconductor chip is electrically connected to the protruding portion of the first conductive layer through chip bumps.

8. The semiconductor package of claim 7, wherein a level of a top surface of the protruding portion is substantially equal to or higher than a level of a top surface of the second conductive layer.

9. The semiconductor package of claim 7, wherein a top surface of the recessed portion is parallel to a top surface of the protruding portion.

10. The semiconductor package of claim 7, wherein the second conductive layer comprises a wiring pattern having a same shape as a shape of the recessed portion of the first conductive layer.

11. The semiconductor package of claim 7, wherein the printed circuit board further comprises outer connection solder balls penetrating the lower solder resist layer, wherein the outer connection solder balls are electrically connected to the first conductive layer.

12. The semiconductor package of claim 7, further comprising heat-dissipation bumps disposed on the second conductive layer, wherein the heat-dissipating bumps are in contact with the semiconductor chip and the second conductive layer through the upper solder resist layer.

13. The semiconductor package of claim 7, wherein the printed circuit board further comprises:
    a third conductive layer disposed between the first conductive layer and the lower solder resist layer;
    a fourth conductive layer disposed between the first and third conductive layers;
    a first insulating layer disposed between the third and fourth conductive layers; and
    a second insulating layer disposed between the first and fourth conductive layers.

14. The semiconductor package of claim 13, wherein the second and fourth conductive layers are respectively connected to power and ground pads of the semiconductor chip, and wherein the first conductive layer is connected to signal pads of the semiconductor chip.

* * * * *